United States Patent
Nagasaka et al.

(10) Patent No.: US 8,721,803 B2
(45) Date of Patent: May 13, 2014

(54) CLEANING LIQUID, CLEANING METHOD, LIQUID GENERATING APPARATUS, EXPOSURE APPARATUS, AND DEVICE FABRICATING METHOD

(75) Inventors: Hiroyuki Nagasaka, Kumagaya (JP); Hiroshi Morita, Hadano (JP); Hiroto Tokoshima, Shimotsuga-gun (JP)

(73) Assignees: Nikon Corporation, Tokyo (JP); Kurita Water Industries Ltd., Tokyo (JP)

( * ) Notice: Subject to any disclaimer, the term of this patent is extended or adjusted under 35 U.S.C. 154(b) by 0 days.

(21) Appl. No.: 13/307,773

(22) Filed: Nov. 30, 2011

(65) Prior Publication Data

US 2012/0067380 A1    Mar. 22, 2012

Related U.S. Application Data

(63) Continuation of application No. 11/987,633, filed on Dec. 3, 2007, now abandoned.

(30) Foreign Application Priority Data

Dec. 5, 2006  (JP) .................................. 2006-328214

(51) Int. Cl.
  *B08B 3/04*  (2006.01)
(52) U.S. Cl.
  USPC .............................. 134/34; 134/22.18; 134/36
(58) Field of Classification Search
  None
  See application file for complete search history.

(56) References Cited

U.S. PATENT DOCUMENTS

| | | | |
|---|---|---|---|
| 4,346,164 | A | 8/1982 | Tabarelli et al. |
| 4,480,910 | A | 11/1984 | Takanashi et al. |
| 5,610,683 | A | 3/1997 | Takahashi |
| 5,715,039 | A | 2/1998 | Fukuda et al. |
| 5,825,043 | A | 10/1998 | Suwa |
| 5,969,441 | A | 10/1999 | Loopstra et al. |
| 6,341,007 | B1 | 1/2002 | Nishi et al. |
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 6,611,316 | B2 | 8/2003 | Sewell |
| 6,778,257 | B2 | 8/2004 | Bleeker et al. |
| 6,897,963 | B1 | 5/2005 | Taniguchi et al. |
| 2004/0165159 | A1 | 8/2004 | Lof et al. |
| 2005/0178401 | A1 | 8/2005 | Boyers |

(Continued)

FOREIGN PATENT DOCUMENTS

| | | |
|---|---|---|
| DE | 221 563 A1 | 9/1983 |
| DE | 221 563 A1 | 4/1985 |

(Continued)

OTHER PUBLICATIONS

Feb. 18, 2011 Office Action in Chinese Patent Application No. 200780049273.3 (with English translation).

(Continued)

Primary Examiner — Michael Kornakov
Assistant Examiner — Ryan Coleman
(74) Attorney, Agent, or Firm — Oliff PLC

(57) ABSTRACT

An exposure apparatus exposes a substrate through an exposure liquid with exposure light. A cleaning liquid is provided to the exposure apparatus, in order to clean at least part of the exposure apparatus. In the cleaning liquid, a prescribed gas of an amount that is greater than or equal to the saturation concentration is dissolved.

8 Claims, 15 Drawing Sheets

(56) References Cited

U.S. PATENT DOCUMENTS

| | | |
|---|---|---|
| 2005/0179997 A1 | 8/2005 | Komatsu et al. |
| 2006/0023182 A1* | 2/2006 | Novak et al. ............ 355/53 |
| 2006/0050351 A1 | 3/2006 | Higashiki |
| 2006/0132731 A1 | 6/2006 | Jansen et al. |
| 2007/0039637 A1 | 2/2007 | Higashiki et al. |
| 2007/0285631 A1* | 12/2007 | Stavenga et al. ........ 355/30 |

FOREIGN PATENT DOCUMENTS

| | | |
|---|---|---|
| DE | 224 448 A1 | 7/1985 |
| EP | 1 713 113 A1 | 10/2006 |
| EP | 1 791 164 A1 | 5/2007 |
| EP | 1 821 338 A1 | 8/2007 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | A-7-220990 | 8/1995 |
| JP | A-8-316125 | 11/1996 |
| JP | A-10-163099 | 6/1998 |
| JP | A-10-214783 | 8/1998 |
| JP | A-10-303114 | 11/1998 |
| JP | A-10-340846 | 12/1998 |
| JP | A-11-135400 | 5/1999 |
| JP | A-11-176727 | 7/1999 |
| JP | A-2000-58436 | 2/2000 |
| JP | A-2000-505958 | 5/2000 |
| JP | A-2000-164504 | 6/2000 |
| JP | A-2004-519850 | 7/2004 |
| JP | A-2004-289127 | 10/2004 |
| JP | A-2005-079222 | 3/2005 |
| JP | A-2006-179909 | 7/2006 |
| JP | A-2006-190997 | 7/2006 |
| JP | A-2006-223995 | 8/2006 |
| WO | WO 99/23692 | 5/1999 |
| WO | WO 99/49504 A1 | 9/1999 |
| WO | WO 01/35168 A1 | 5/2001 |
| WO | WO 02/069049 A2 | 9/2002 |
| WO | WO 02/069049 A3 | 9/2002 |
| WO | WO 2004/019128 A2 | 3/2004 |
| WO | WO 2005/074014 A1 | 8/2005 |
| WO | WO 2006/013806 A1 | 2/2006 |

OTHER PUBLICATIONS

Feb. 26, 2008 International Search Report in PCT Patent Application No. PCT/JP2007/073414 (with English Translation).

Feb. 26, 2008 Written Opinion in PCT Patent Application No. PCT/JP2007/073414 (with English Translation).

Computer translation of JP2005-079222 by Watanabe et al., published Mar. 24, 2005.

Oct. 6, 2010 Office Action issued in U.S. Appl. No. 11/987,633.

Jun. 30, 2011 Office Action issued in U.S. Appl. No. 11/987,633.

Jun. 4, 2013 Office Action issued in Chinese Patent Application No. 200780049273.3 (with translation).

Sep. 11, 2012 Office Action issued in Japanese Patent Application No. 2008-548296 w/translation.

Jul. 16, 2013 Office Action issued in Taiwanese Patent Application No. 096146002 (with translation).

Nov. 11, 2013 Office Action issued in Korean Patent Application No. 10-2009-7013736 (with translation).

Jan. 23, 2014 Office Action issued in Chinese Patent Application No. 200780049273.3 (with translation).

Jan. 22, 2014 Office Action issued in Taiwanese Patent Application No. 096146002 (with translation).

* cited by examiner

CLEANING LIQUID, CLEANING METHOD, LIQUID GENERATING APPARATUS, EXPOSURE APPARATUS, AND DEVICE FABRICATING METHOD

CROSS-REFERENCE TO RELATED APPLICATION

This application is a continuation of U.S. patent application Ser. No. 11/987,633 filed Dec. 3, 2007 which claims priority to Japanese Patent Application No. 2006-328214, filed Dec. 5, 2006, the contents of which are incorporated herein by reference.

BACKGROUND

1. Field of the Invention

The present invention relates to a cleaning liquid, a cleaning method, a liquid generating apparatus, an exposure apparatus, and a device fabricating method. The present invention particularly relates to a cleaning liquid, a cleaning method, and a liquid generating apparatus for cleaning members that contact a liquid inside a liquid immersion exposure apparatus.

2. Description of Related Art

As disclosed in PCT International Publication No. WO99/49504 and Japanese Patent Application, Publication No. 2004-289127, a liquid immersion exposure apparatus is known among exposure apparatuses used in photolithographic processes that exposes a substrate with exposure light through an exposure liquid.

DISCLOSURE OF THE INVENTION

Problems Solved by the Invention

In a liquid immersion exposure apparatus, there is a possibility that, for example, members that contact the exposure liquid will become contaminated. If members of an exposure apparatus are left in a contaminated state, then there is a possibility that the degree of contamination will increase and that the performance of the exposure apparatus (e.g., the yield) will deteriorate. If the process of cleaning the members of the exposure apparatus requires a lot of time, then the exposure apparatus operating ratio and device productivity decline. In addition, depending on the cleaning technique that is used, there is a possibility that the exposure apparatus will be damaged inadvertently. Consequently, there is a demand to develop a technology that can clean the exposure apparatus efficiently and satisfactorily.

A purpose of some aspects of the invention is to provide a cleaning liquid and a cleaning method that can clean the exposure apparatus satisfactorily, as well as a liquid generating apparatus that can feed that cleaning liquid.

Another purpose is to provide an exposure apparatus that can prevent the deterioration of performance that is caused by the contamination of the members, and a device fabricating method that uses the exposure apparatus.

SUMMARY

A first aspect of the invention provides a cleaning liquid that is supplied to an exposure apparatus in order to clean at least part of the exposure apparatus, which exposes a substrate with exposure light through an exposure liquid, wherein a prescribed gas of an amount that is greater than or equal to the saturation concentration is dissolved.

According to the first aspect of the invention, it is possible to clean the exposure apparatus satisfactorily.

A second aspect of the invention provides a cleaning method that cleans at least part of the exposure apparatus, wherein a cleaning liquid according to the abovementioned aspect is supplied to the exposure apparatus.

According to the second aspect of the invention, it is possible to clean the exposure apparatus satisfactorily and to prevent deterioration in the performance of the exposure apparatus.

A third aspect of the invention provides a liquid generating apparatus that feeds a cleaning liquid according to the abovementioned aspects.

According to the third aspect of the invention, it is possible to clean the exposure apparatus satisfactorily and to prevent deterioration in the performance of the exposure apparatus.

A fourth aspect of the invention provides an exposure apparatus that exposes a substrate with exposure light through an exposure liquid and that comprises a passageway in which a cleaning liquid, in which a prescribed gas of an amount that is greater than or equal to the saturation concentration is dissolved, flows.

According to the fourth aspect of the invention, it is possible to prevent deterioration in performance that is caused by contamination.

A fifth aspect of the invention provides a device fabricating method that comprises the steps of: exposing the substrate using the exposure apparatus according to the abovementioned aspects; and developing the exposed substrate.

According to the fifth aspect of the invention, it is possible to use the exposure apparatus, which prevents deterioration in performance, to fabricate a device.

Effects of the Invention

According to the some aspects of the present invention, it is possible to clean an exposure apparatus satisfactorily and to prevent deterioration in the performance of the exposure apparatus that is caused by contamination. Accordingly, it is possible to expose a substrate satisfactorily and thereby to fabricate a device that has a desired performance.

DESCRIPTION OF THE PREFERRED EMBODIMENTS

The following explains the embodiments of the present invention referencing the drawings, but the present invention is not limited thereto. Furthermore, the following explanation defines an XYZ orthogonal coordinate system and the positional relationships of the members are explained referencing this system. Furthermore, prescribed directions within the horizontal plane are the X axial directions, directions that are orthogonal to the X axial directions in the horizontal plane are the Y axial directions, and directions that are orthogonal to the X axial directions and the Y axial directions (i.e., the vertical directions) are the Z axial directions. In addition, the rotational (the inclined) directions around the X, Y, and Z axes are the θX, θY, and θZ directions, respectively.

First Embodiment

Figure 1:
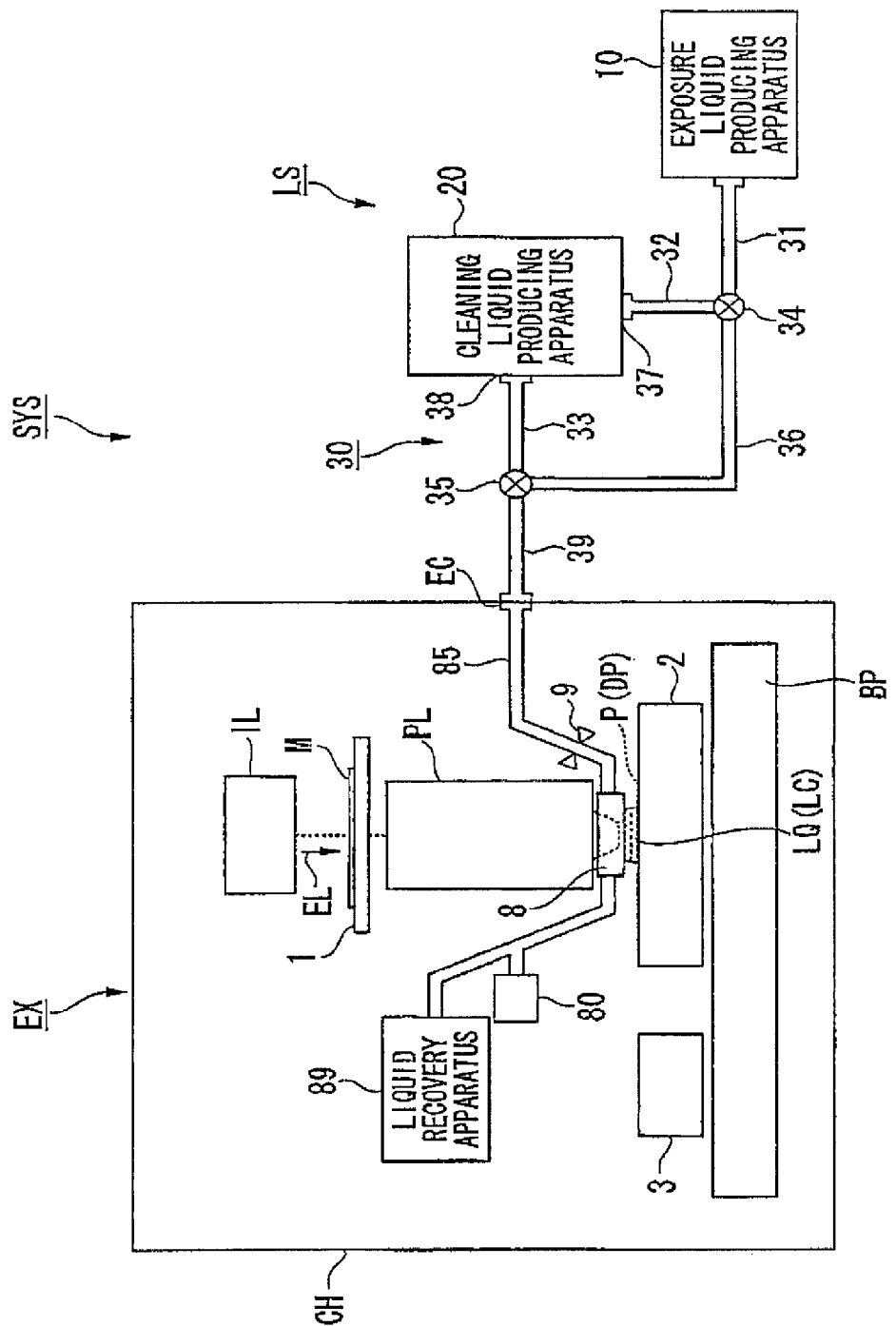
FIG. 1 is a schematic block diagram that shows a device fabrication system according to a first embodiment.

The first embodiment will now be explained. FIG. 1 is a schematic block diagram that shows an exposure system SYS according to a first embodiment. In FIG. 1, the exposure system SYS comprises an exposure apparatus EX, which exposes a substrate P with exposure light EL, and a liquid generating system LS that generates a prescribed liquid.

The exposure apparatus EX of the present embodiment is an exposure apparatus that uses the liquid immersion method in order to shorten the exposure wavelength substantially, improve the resolution, as well as increase the depth of focus substantially, and exposes the substrate P with the exposure light EL through exposure liquid LQ.

The liquid generating system LS is capable of generating the exposure liquid LQ and a cleaning liquid LC that is supplied to the exposure apparatus EX in order to clean at least part of the exposure apparatus EX. The liquid generating system LS of the present embodiment comprises an exposure liquid producing apparatus 10, which produces the exposure liquid LQ, and a cleaning liquid producing apparatus 20, which is capable of generating the cleaning liquid LC. The exposure apparatus EX comprises a piping system 30 that forms a passageway for at least one of the exposure liquid LQ, which is produced by the exposure liquid producing apparatus 10, and the cleaning liquid LC, which is produced by the cleaning liquid producing apparatus 20. The piping system 30 comprises a passageway in order to supply at least one of the exposure liquid LQ and the cleaning liquid LC to, for example, a nozzle member (discussed later in detail) of the exposure apparatus EX.

The exposure liquid producing apparatus 10 produces the exposure liquid LQ and feeds the produced exposure liquid LQ to the piping system 30. The cleaning liquid producing apparatus 20 produces the cleaning liquid LC and feeds the produced cleaning liquid LC to the piping system 30.

The liquid generating system LS is capable of supplying both the exposure liquid LQ, which is produced by the exposure liquid producing apparatus 10, and the cleaning liquid LC, which is produced by the cleaning liquid producing apparatus 20, to the piping system 30 of the exposure apparatus EX.

In the present embodiment, the exposure liquid LQ is pure water. The exposure liquid producing apparatus 10 comprises a pure water producing apparatus, and is capable of producing the pure water. The exposure liquid producing apparatus 10 feeds sufficiently degasified pure water, which serves as the exposure liquid LQ.

The cleaning liquid LC is a prescribed liquid in which a prescribed gas of an amount that is greater than or equal to the saturation concentration under atmospheric pressure is dissolved (a prescribed liquid in which a prescribed gas of an amount that is greater than or equal to the soluble amount under atmospheric pressure is dissolved). In other words, the cleaning liquid LC is a prescribed liquid in which a prescribed gas is dissolved up to the supersaturated state. If the saturation amount under atmospheric pressure is 1, then a dissolved amount of 1 to 4 is desirable and approximately 2 to 3 is preferable.

In the present embodiment, the cleaning liquid LC is produced by dissolving the prescribed gas of an amount that is greater than or equal to the saturation concentration under atmospheric pressure in the exposure liquid LQ. In addition, in the present embodiment, the prescribed gas that is dissolved in the cleaning liquid LC includes nitrogen. Accordingly, the cleaning liquid LC of the present embodiment is by dissolving nitrogen of an amount that is greater than or equal to the saturation concentration under atmospheric pressure in pure water.

The cleaning liquid producing apparatus 20 generates the cleaning liquid LC by dissolving the prescribed gas (nitrogen) of an amount that is greater than or equal to the saturation concentration under atmospheric pressure in the exposure liquid LQ (pure water), which is produced by the exposure liquid producing apparatus 10. For example, the cleaning liquid producing apparatus 20 produces the cleaning liquid LC using, for example, a gas permeable membrane to dissolve the prescribed gas in the exposure liquid LQ until it reaches the supersaturated state.

In addition, in the present embodiment, the cleaning liquid LC contains an alkali. The alkali includes, for example, ammonia. Accordingly, the cleaning liquid producing apparatus 20 of the present embodiment is capable of generating the cleaning liquid LC by dissolving the prescribed gas (nitrogen) of an amount that is greater than or equal to the saturation concentration under atmospheric pressure in the exposure liquid LQ (pure water) and then adding the alkali (ammonia) thereto.

The exposure apparatus EX comprises a connection mechanism EC. The connection mechanism EC of the exposure apparatus EX is connected to the piping system 30 and at least one of the exposure liquid LQ and the cleaning liquid LC is supplied to, for example, a nozzle member 8, which is discussed below and is installed inside a chamber CH, via the connection mechanism EC.

The piping system 30 comprises: a first passageway 31, one end of which is connected to the exposure liquid producing apparatus 10 and the other end of which is connected to a first passageway switching mechanism (first valve mechanism) 34; a second passageway 32, one end of which is connected to the cleaning liquid producing apparatus 20 and the other end of which is connected to the first valve mechanism 34; a third passageway 33, one end of which is connected to the cleaning liquid producing apparatus 20 and the other end of which is connected to a second passageway switching mechanism (second valve mechanism) 35; a fourth passageway 36, one end of which is connected to the first valve mechanism 34 and the other end of which is connected to the second valve mechanism 35; and a fifth passageway 39, one end of which is connected to the second valve mechanism 35 and the other end of which is connected to the connection mechanism EC.

The passageway in which the exposure liquid LQ flows from the first passageway 31 to the second passageway 32 and the passageway in which the exposure liquid LQ flows from the first passageway 31 to the fourth passageway 36 are switched by the first valve mechanism 34.

In addition, the passageway in which the cleaning liquid LC flows from the third passageway 33 to the fifth passageway 39 and the passageway in which the exposure liquid LQ flows from the fourth passageway 36 to the fifth passageway 39 are switched by the second valve mechanism 35.

The cleaning liquid producing apparatus 20 comprises a first connecting part 37 that is connected to one end of the second passageway 32.

In addition, the cleaning liquid producing apparatus 20 comprises a second connecting part 38 that is connected to one end of the third passageway 33.

The exposure liquid LQ that is fed from the exposure liquid producing apparatus 10 can reach the connection mechanism EC of the exposure apparatus EX through the first passageway 31, the first valve mechanism 34, the fourth passageway 36, the second valve mechanism 35, and the fifth passageway 39.

In addition, in the present embodiment, the cleaning liquid producing apparatus 20 is disposed on the downstream side of the exposure liquid producing apparatus 10, and the exposure liquid LQ that is fed from the exposure liquid producing apparatus 10 can reach the cleaning liquid producing apparatus 20 through the first passageway 31, the first valve mechanism 34, and the second passageway 32.

In addition, the cleaning liquid LC that is fed from the cleaning liquid producing apparatus 20 can reach the connection mechanism EC of the exposure apparatus EX through the third passageway 33, the second valve mechanism 35, and the fifth passageway 39.

Figure 2:
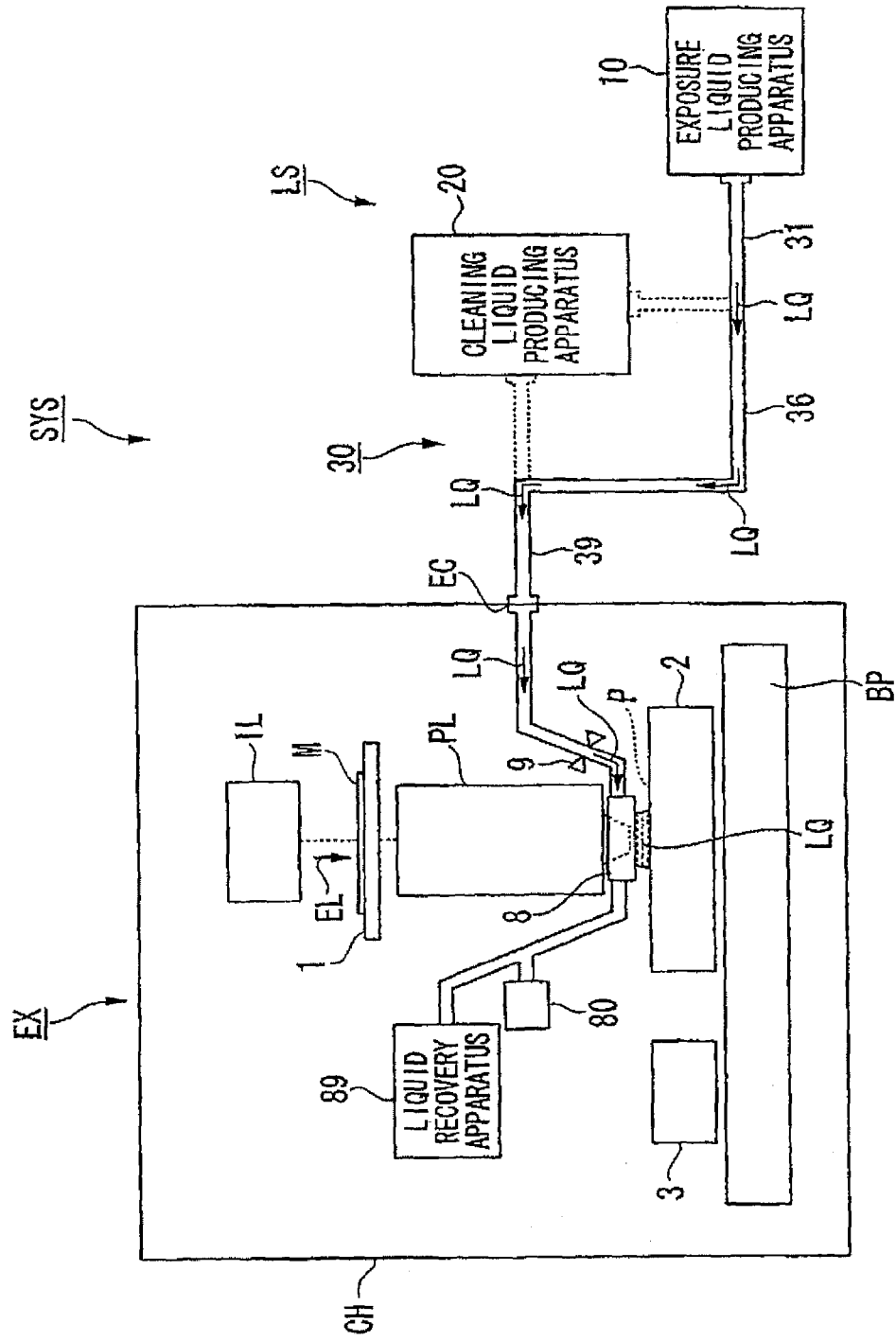
FIG. 2 is a view for explaining one example of the operation of a liquid generating system according to the first embodiment.

FIG. 2 is a schematic drawing that shows a state wherein the liquid generating system LS supplies the exposure liquid LQ to the exposure apparatus EX. The exposure apparatus EX controls the first and second valve mechanisms 34, 35 so as to establish a passageway such that the exposure liquid LQ from the exposure liquid producing apparatus 10 reaches the connection mechanism EC of the exposure apparatus EX. As shown in FIG. 2, the exposure liquid LQ that is fed from the exposure liquid producing apparatus 10 flows through the first passageway 31 and the fourth passageway 36 into the fifth passageway 39.

Figure 3:
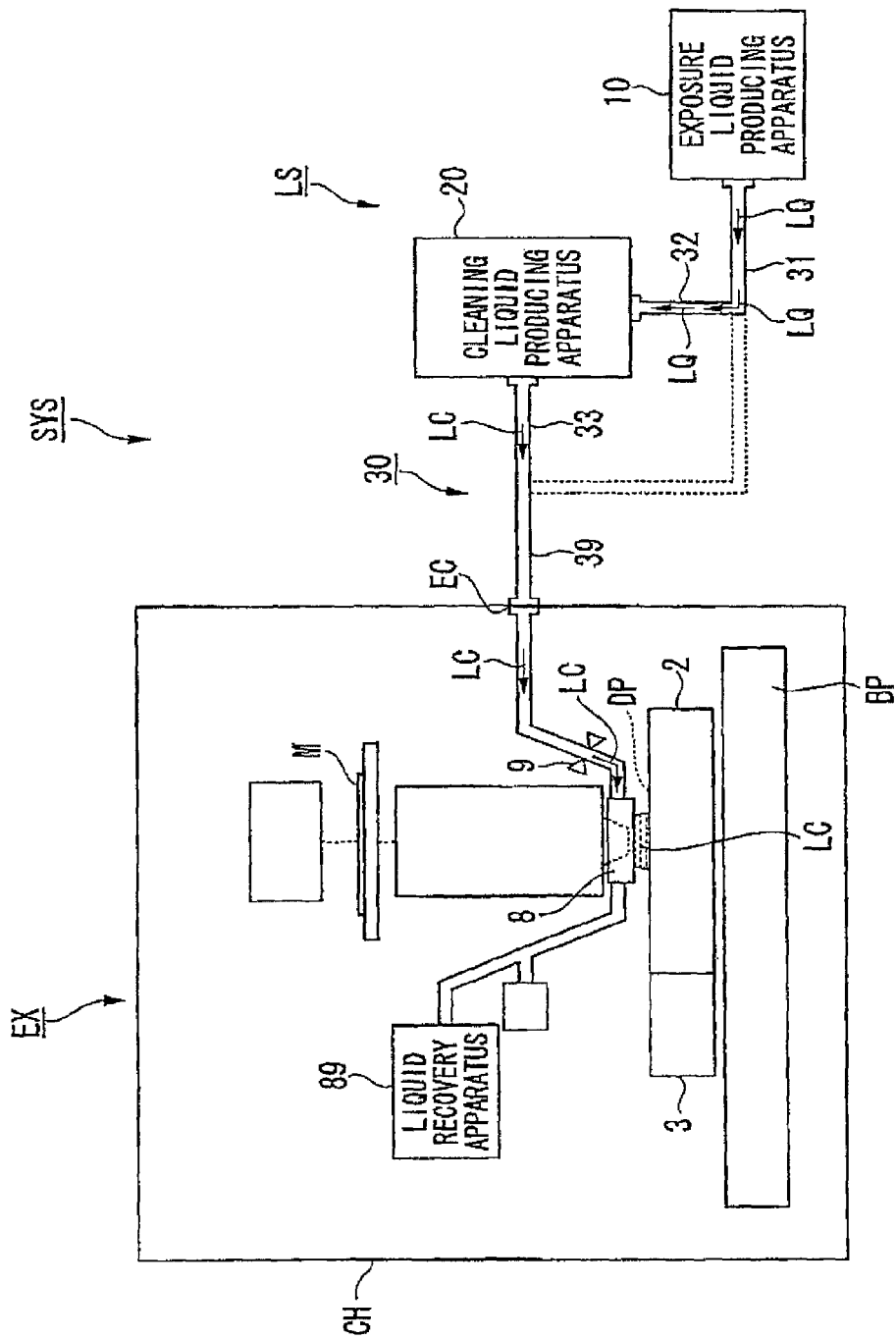
FIG. 3 is a view for explaining one example of the operation of the liquid generating system according to the first embodiment.

FIG. 3 shows a state wherein the liquid generating system LS supplies the cleaning liquid LC to the exposure apparatus EX. The exposure apparatus EX controls the first valve mechanism 34 so as to establish a passageway such that the exposure liquid LQ from the exposure liquid producing apparatus 10 is supplied to the cleaning liquid producing apparatus 20. As shown in FIG. 3, the exposure liquid LQ that is fed from the exposure liquid producing apparatus 10 flows through the first passageway 31 and the second passageway 32 and is supplied to the cleaning liquid producing apparatus 20.

The cleaning liquid producing apparatus 20 uses the exposure liquid LQ that is supplied by the exposure liquid producing apparatus 10 to generate the cleaning liquid LC.

In addition, the exposure apparatus EX controls the second valve mechanism 35 so as to establish a passageway such that the cleaning liquid LC that is fed from the cleaning liquid producing apparatus 20 reaches the connection mechanism EC of the exposure apparatus EX. As shown in FIG. 3, the cleaning liquid LC that is fed from the cleaning liquid producing apparatus 20 flows through the third passageway 33 into the fifth passageway 39.

Thus, in the present embodiment, the cleaning liquid producing apparatus 20 is disposed on the downstream side of the exposure liquid producing apparatus 10 and uses the exposure liquid LQ that is fed by the exposure liquid producing apparatus 10 to produce the cleaning liquid LC.

In the following explanation, the state wherein the liquid generating system LS supplies the exposure liquid LQ to the exposure apparatus EX, as shown in FIG. 2, is appropriately called a first mode, and the state wherein the liquid generating system LS supplies the cleaning liquid LC to the exposure apparatus EX, as shown in FIG. 3, is appropriately called a second mode.

Figure 4:
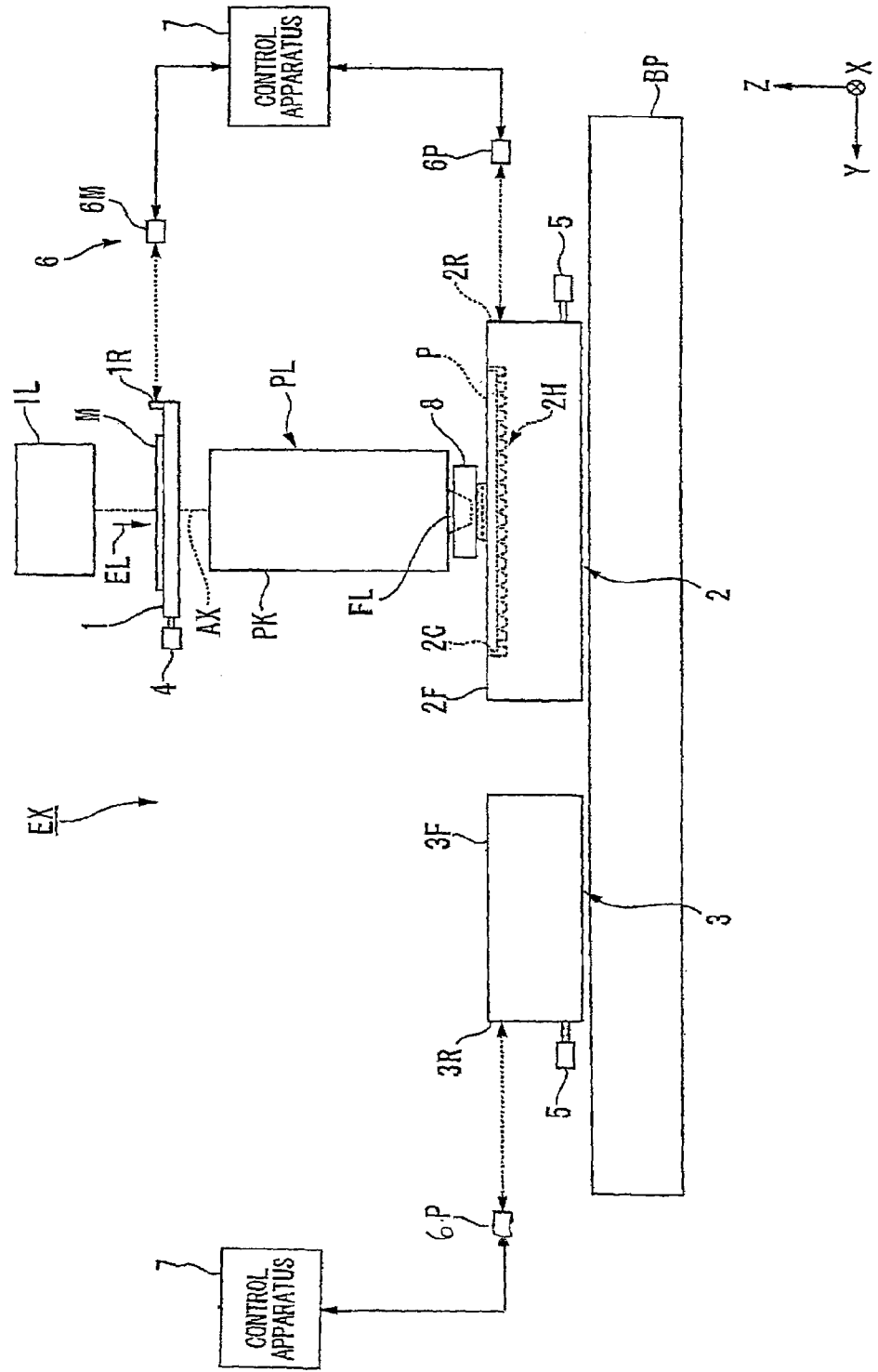
FIG. 4 is a schematic block diagram that shows the exposure apparatus according to the first embodiment.

The exposure apparatus EX will now be explained, referencing FIG. 4. FIG. 4 is a schematic block diagram that shows the exposure apparatus EX according to the present embodiment. In FIG. 4, the exposure apparatus EX comprises: a movable mask stage 1, which holds a mask M; a movable substrate stage 2, which holds the substrate P; a movable measurement stage 3, which moves independently of the substrate stage 2 and whereon a measuring instrument is mounted that is capable of performing a measurement related to the exposure without holding the substrate P; a drive mechanism 4, which moves the mask stage 1; a drive mechanism 5, which moves the substrate stage 2 and the measurement stage 3; a measurement system 6, which comprises laser interferometers that obtain positional information of the stages; an illumination system IL, which illuminates the mask M with the exposure light EL; a projection optical system PL, which projects an image of a pattern of the mask M that is illuminated with the exposure light EL onto the substrate P; and a control apparatus 7 that controls the operation of the entire exposure apparatus EX. In addition, in the present embodiment, the mask stage 1, the substrate stage 2, the measurement stage 3, the drive mechanism 4, the drive mechanism 5, the measurement system 6, the illumination system IL, and the projection optical system PL are disposed inside the chamber CH.

Furthermore, the substrate P referenced here is an exposure substrate for fabricating a device and can include one that has a base material, such as a semiconductor wafer, whereon a film, such as a photosensitive material (photoresist), is formed. The substrate P has a substantially circular shape. The mask M includes a reticle wherein a device pattern is formed that is projected onto the substrate P. In addition, a transmitting type mask is used as the mask M in the present embodiment, but a reflection type mask can also be used.

As discussed above, the exposure apparatus EX of the present embodiment is a liquid immersion exposure apparatus that exposes the substrate P with the exposure light EL through the exposure liquid LQ and comprises the nozzle member 8 that is capable of forming an immersion space using the exposure liquid LQ that is supplied by the liquid generating system LS so that an optical path space of the exposure light EL is filled with the exposure liquid LQ. The exposure apparatus EX exposes the substrate P by forming the immersion space using the exposure liquid LQ between the nozzle member 8 and the substrate P, and irradiating the substrate P with the exposure light EL through the exposure liquid LQ.

In addition, in the present embodiment, the nozzle member 8 is capable of forming the immersion space using the cleaning liquid LC that is supplied by the liquid generating system LS.

Furthermore, the optical path space of the exposure light EL is the space that includes the optical path through which the exposure light EL travels. The immersion space is a space that is filled with liquid (the exposure liquid LQ or the cleaning liquid LC).

The projection optical system PL has a plurality of optical elements and a last optical element FL of the plurality of optical elements that is closest to the image plane of the projection optical system PL has a light emergent surface (a lower surface) that emits the exposure light EL. The substrate stage 2 is capable of moving on the light emergent side of the last optical element FL (the image plane side of the projection optical system PL). The measurement stage 3 is capable of moving on the light emergent side of the last optical element FL (the image plane side of the projection optical system PL) independently of the substrate stage 2.

The nozzle member 8 is disposed in the vicinity of the last optical element FL of the projection optical system PL. The liquid can be retained between the nozzle member 8 and an object that is disposed at a position at which that object can be irradiated by the exposure light EL from the last optical element FL. Namely, by holding the liquid between the nozzle member 8 and that object, the immersion space of the liquid is formed so that the optical path space of the exposure light EL on the light emergent side of the last optical element FL, specifically the optical path space of the exposure light EL between the last optical element FL and the object, is filled with the liquid.

The objects that are capable of opposing the nozzle member 8 and the last optical element FL include objects that are capable of moving on the light emergent side of the last optical element FL. In the present embodiment, the objects that can oppose the nozzle member 8 and the last optical element FL include at least one of the substrate stage 2 and the measurement stage 3. In addition, objects that are capable of opposing the nozzle member 8 and the last optical element FL include the substrate P, which is held by the substrate stage 2.

In the present embodiment, the nozzle member 8 forms the immersion space between itself and the last optical element FL on one side and the object (at least one of the substrate stage 2, the measurement stage 3, and the substrate P) on the other side so that part of the area (the local area) on the front surface of the object is covered with the liquid.

In addition, the substrate stage 2 and the measurement stage 3 are capable of moving relative to the last optical element FL and the nozzle member 8. Therefore, the object is movable relative to the last optical element FL and the nozzle member 8 while the state wherein the immersion space is formed between the last optical element FL and the nozzle member 8 on one side and the object (at least one of the substrate P, the substrate stage 2, and the measurement stage 3) on the other side is maintained.

The illumination system IL illuminates a prescribed illumination region on the mask M with the exposure light EL, which has a uniform luminous flux intensity distribution. Examples of light that can be used as the exposure light EL emitted from the illumination system IL include: deep ultraviolet light (DUV light) such as bright line (g-line, h-line, or i-line) light emitted from, for example, a mercury lamp, and KrF excimer laser light (248 nm wavelength); and vacuum ultraviolet light (VUV light) such as ArF excimer laser light (193 nm wavelength) and $F_2$ laser light (157 nm wavelength). ArF excimer laser light is used as the exposure light EL in the present embodiment.

The drive mechanism 4, which comprises actuators such as linear motors, is capable of moving the mask stage 1 in the X axial, Y axial, and θZ directions in a state wherein it holds the mask M. Laser interferometers 6M of the measurement system 6 measure the position of the mask stage 1 (and, in turn, the mask M). The laser interferometers 6M use measurement mirrors 1R, which are provided on the mask stage 1, to measure the position of the mask stage 1 in the X axial, Y axial, and θZ directions. The control apparatus 7 controls the position of the mask M, which is held by the mask stage 1, based on the measurement results of the measurement system 6 by driving the drive mechanism 4.

The projection optical system PL projects an image of the pattern of the mask M to the substrate P at a prescribed projection magnification. The projection optical system PL comprises the plurality of optical elements that is held by a lens barrel PK. The projection optical system PL of the present embodiment is a reduction system that has a projection magnification of, for example, ¼, ⅕, or ⅛. Furthermore, the projection optical system PL may also be a unity magnification system or an enlargement system. In the present embodiment, an optical axis AX of the projection optical system PL is parallel to the Z axial directions. In addition, the projection optical system PL may be: a dioptrie system that does not include catoptric elements; a catoptric system that does not include dioptric elements; or a catadioptric system that includes both catoptric elements and dioptric elements. In addition, the projection optical system PL may form either an inverted image or an erect image.

The substrate stage 2 comprises a substrate holder 2H, which detachably holds the substrate P, and the drive apparatus 5, which includes an actuator such as a linear motor, is capable of moving the substrate stage 2 on a base member BP with six degrees of freedom, i.e., in the X axial, Y axial, Z axial, θX, θY, and θZ directions, in a state wherein the substrate P is held by the substrate holder 211. The substrate stage 2 comprises a recessed part 2C wherein the substrate holder 2H is disposed. An upper surface 2F that surrounds the recessed part 2C of the substrate stage 2 is substantially flat and is substantially the same height as (is flush with) the front surface of the substrate P, which is held by the substrate holder 2H. Furthermore, the upper surface 2F of the substrate stage 2 is preferably liquid repellent with respect to the exposure liquid LQ (the contact angle between the exposure liquid LQ and the upper surface 2F is preferably greater than or equal to 80°).

The measurement stage 3 is equipped with measuring instruments, which include various photoelectric sensors and/or a fiducial member whereon a fiducial mark is formed and are capable of performing measurements related to exposure (e.g., the measurement of the luminous flux intensity of the exposure light EL), and the drive mechanism 5 is capable of moving the measurement stage 3 on the base member BP with six degrees of freedom, i.e., the X axial, Y axial, Z axial, θX, θY, and θZ directions, in a state wherein the measuring instruments are installed. An upper surface 3F of the measurement stage 3 is substantially flat. Furthermore, the upper surface 3F of the measurement stage 3 is also preferably liquid repellent with respect to the exposure liquid LQ (the contact angle between the exposure liquid LQ and the upper surface 3F is preferably greater than or equal to 80°).

Positions of the substrate stage 2 and of the measurement stage 3 are measured by laser interferometers 6P of the measurement system 6. The laser interferometers 6P use measurement mirrors 2R, 3R of the stages 2, 3, respectively, to measure the positions of the stages 2, 3 in the X axial, Y axial, and θZ directions. In addition, a focus leveling detection system (not shown) of the measurement system 6 detects surface positions (positions related to the Z axial, θX, and θY directions) about both the front surface of the substrate P held by the substrate holder 2H of the substrate stage 2 and a prescribed area on the upper surface 3F of the measurement stage 3. Based on the measurement results of the laser interferometers 6P of the measurement system 6 and on the detection results of the focus leveling detection system, the control apparatus 7 uses the drive mechanism 5 to move the substrate stage 2 and thereby controls the position of the substrate P held by the substrate holder 2H of the substrate stage 2 and the position of the measurement stage 3.

Furthermore, an exposure apparatus that comprises a substrate stage, which holds a substrate, and a measurement stage, whereon a measuring instrument is installed, is disclosed in, for example, Japanese Patent Application, Publication No. H11-135400 (corresponding PCT International Publication No. WO 1999/23692) and Japanese Patent Application, Publication No. 2000-164504 (corresponding U.S. Pat. No. 6,897,963).

Figure 5:
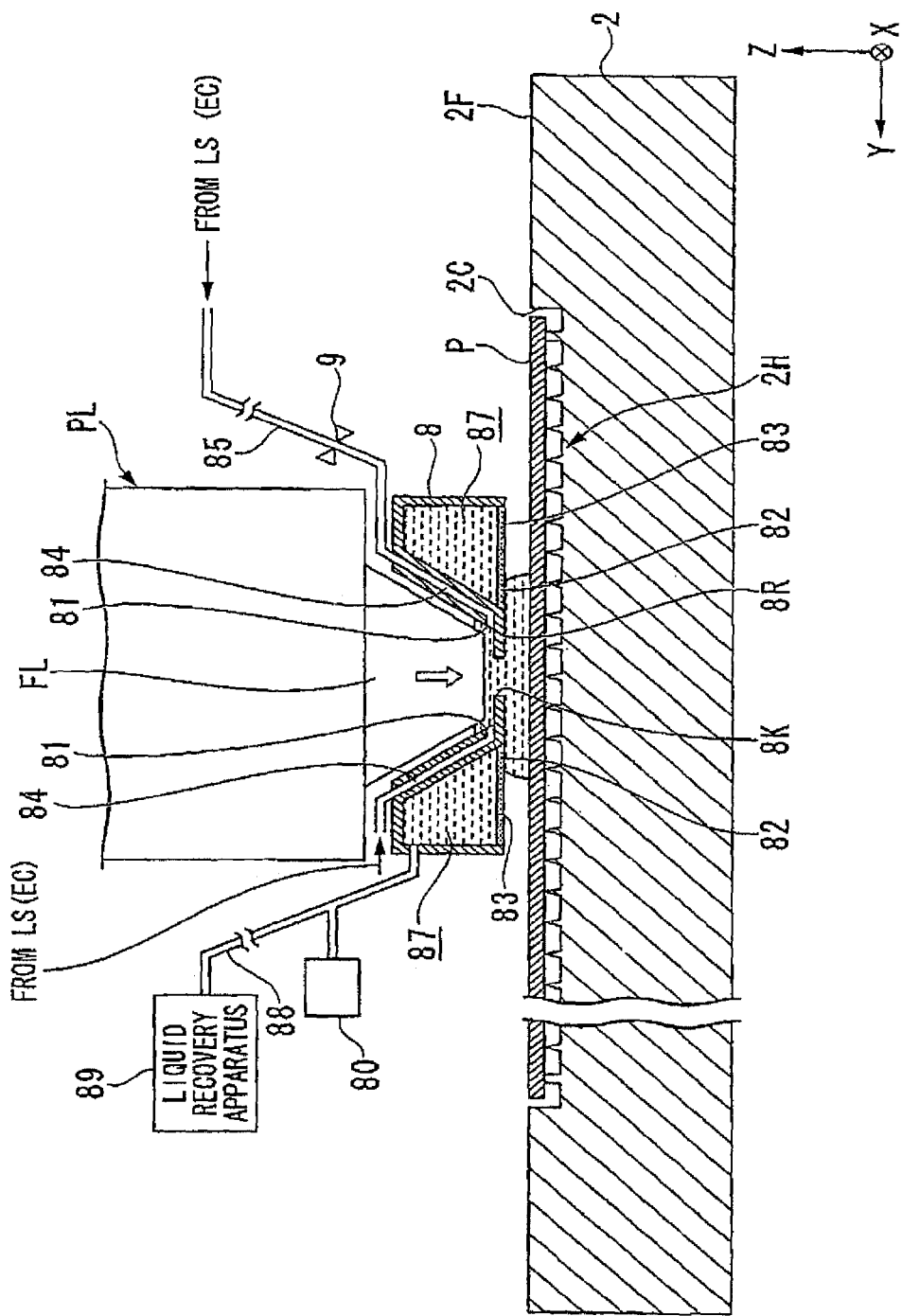
FIG. 5 is a cross sectional view that shows the vicinity of a nozzle member according to the first embodiment.

FIG. 5 is a view that shows the vicinity of the nozzle member 8. The nozzle member 8 forms the immersion space between itself and the object (at least one of the substrate stage 2, the measurement stage 3, and the substrate P) that is disposed at a position that opposes the nozzle member 8 using the liquid (the exposure liquid LQ or the cleaning liquid LC). The following explains an exemplary case wherein the substrate P is disposed at a position that opposes the nozzle member 8, and the nozzle member 8 holds the exposure liquid LQ between itself and the front surface of the substrate P, thereby forming the immersion space.

The nozzle member 8 has a lower surface and is capable of holding the exposure liquid LQ between that lower surface and the front surface of the substrate P. By holding the exposure liquid LQ between itself and the front surface of the substrate P, the nozzle member 8 fills the optical path space of the exposure light EL on the image plane side (the light emergent side) of the projection optical system PL with the exposure liquid LQ.

In the present embodiment, the exposure apparatus EX forms the immersion space between the nozzle member 8 and the substrate P so that part of the area (a local area) of the front surface of the substrate P is covered with the exposure liquid LQ. Namely, the exposure apparatus EX of the present embodiment adopts a local liquid immersion system wherein the immersion space is formed between the nozzle member 8 and the substrate P so that part of the area on the substrate P that includes the projection area of the projection optical system PL is covered with the exposure liquid LQ during the exposure of the substrate P.

As shown in FIG. 5, the nozzle member 8 has a supply port 81, which is capable of supplying the exposure liquid LQ, and a recovery port 82, which is capable of recovering the exposure liquid LQ. A porous member (mesh) 83 is disposed in the recovery port 82.

In the present embodiment, the lower surface of the nozzle member 8 includes the lower surface of the porous member 83 and a flat surface 8R, which is disposed so that it surrounds an opening 8K that is for passing the exposure light EL therethrough.

The supply port 81 is connected to the liquid generating system LS through a supply passageway 84, which is formed inside the nozzle member 8, a supply pipe 85, the connection mechanism EC, and the piping system 30. The recovery port 82 is connected to a liquid recovery apparatus 89, which is capable of recovering the exposure liquid LQ, through a recovery passageway 87, which is formed inside the nozzle member 8, and a recovery pipe 88.

The exposure liquid LQ, the temperature of which is adjusted by a temperature regulating apparatus (not shown), is supplied by the liquid generating system LS. The liquid recovery apparatus 89 comprises, for example, a vacuum system and is capable of recovering the exposure liquid LQ. The exposure liquid LQ that is supplied by the liquid generating system LS through the piping system 30 and the connection mechanism EC is then supplied through the supply pipe 85 and the supply passageway 84 of the nozzle member 8 to the optical path space of the exposure light EL via the supply port 81. In addition, the liquid recovery apparatus 89 recovers the exposure liquid LQ via the recovery port 82 and through the recovery passageway 87 of the nozzle member 8 and the recovery pipe 88. The exposure apparatus EX forms the immersion space of the exposure liquid LQ by performing the operation of supplying the liquid LQ via the supply port 81 and the operation of recovering such via the recovery port 82 in parallel so that the exposure liquid LQ fills the optical path space of the exposure light EL between the last optical element FL and the substrate P.

In addition, in the present embodiment, the exposure apparatus EX comprises a pressure adjustment mechanism 9, which is disposed in part of the supply pipe 85 inside the chamber CH and is capable of adjusting the pressure of the liquid that flows inside the supply pipe 85. The pressure adjustment mechanism 9 includes, for example, a valve mechanism. Furthermore, the pressure adjustment mechanism 9 is used principally in the second mode, wherein the cleaning liquid LC is supplied by the cleaning liquid producing apparatus 20, and adjusts the flow volume of the cleaning liquid LC that flows from the supply pipe 85 to the nozzle member 8 so that a desired pressure is applied to the cleaning liquid LC that resides inside the third passageway 33, the fifth passageway 39, and the passageway of the supply pipe 85. In addition, as discussed below, the pressure adjustment mechanism 9 is preferably disposed at a position that is as close as possible to the nozzle member 8; therefore, if the pressure adjustment mechanism 9 and a flow volume adjustment valve that adjusts the flow volume of the exposure liquid LQ supplied via the supply port 81 are installed in the supply pipe 85 separately, then it is preferable to provide the pressure adjustment mechanism 9 to the passageway between the nozzle member 8 and the flow volume adjustment valve for the exposure liquid LQ.

Furthermore, the pressure adjustment mechanism 9 may simultaneously serve as the flow volume adjustment valve for the exposure liquid LQ.

In addition, in the present embodiment, the exposure apparatus EX comprises a detection apparatus 80, which detects the quality (the water quality) of the exposure liquid LQ that is recovered via the recovery port 82.

Figure 6:
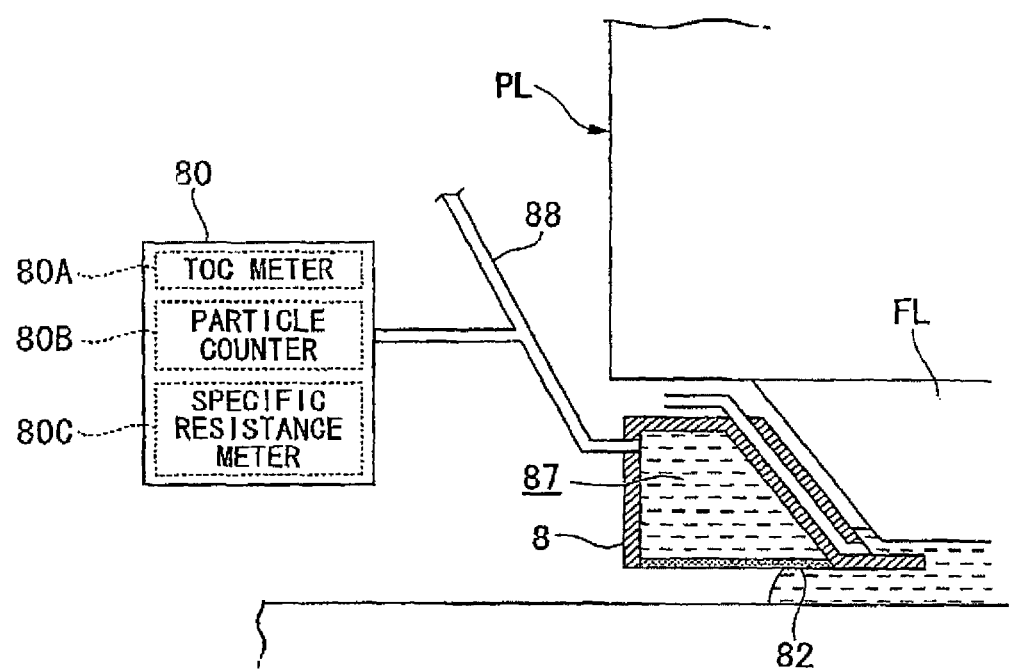
FIG. 6 is a view for explaining a detection apparatus according to the first embodiment.

FIG. 6 is a schematic drawing that shows one example of the detection apparatus 80. As shown in FIG. 6, in the present embodiment, the detection apparatus 80 comprises, for example, a TOC meter 80A, which measures the total organic carbon in the exposure liquid LQ that is recovered via the recovery port 82, a particle counter 80B, which detects foreign matter (particles) in the exposure liquid LQ, and a specific resistance meter 80C, which measures the specific resistance of the exposure liquid LQ; in addition, the detection apparatus 80 is capable of detecting the contamination state of the exposure liquid LQ that is recovered via the recovery port 82. Furthermore, known apparatuses can constitute the detection apparatus 80, and therefore a detailed explanation thereof is omitted. In addition, the measuring apparatuses that are included in the detection apparatus 80 are not limited to the ones discussed above. In addition, the detection apparatus 80 need not comprise all of the measuring apparatuses discussed above.

The following explains a method of using the exposure apparatus EX that has the abovementioned configuration to expose the substrate P.

When a normal exposure operation (exposure sequence) is performed, the first valve mechanism 34 and the second valve mechanism 35 are set to the first mode. The control apparatus 7 uses, for example, the drive mechanism 5 to dispose the measurement stage 3 at a position that opposes the nozzle member 8 and forms the immersion space between the nozzle member 8 and the measurement stage 3 using the exposure liquid LQ. Furthermore, the control apparatus 7 uses the various measuring instruments, which are disposed in the measurement stage 3, to perform measurements through the immersion space that is formed with the exposure liquid LQ. Furthermore, based on the measurement results of those measuring instruments, the control apparatus 7 adjusts, for example, the imaging characteristics of the projection optical system PL and the exposure conditions to be used during the exposure of the substrate P, and then starts the operation of exposing the substrate P. The control apparatus 7 uses the drive mechanism 5 to dispose the substrate stage 2, which holds the substrate P, at a position that opposes the nozzle member 8 and forms the immersion space between the nozzle member 8 and the substrate stage 2 (the substrate P) using the exposure liquid LQ.

Figure 7:
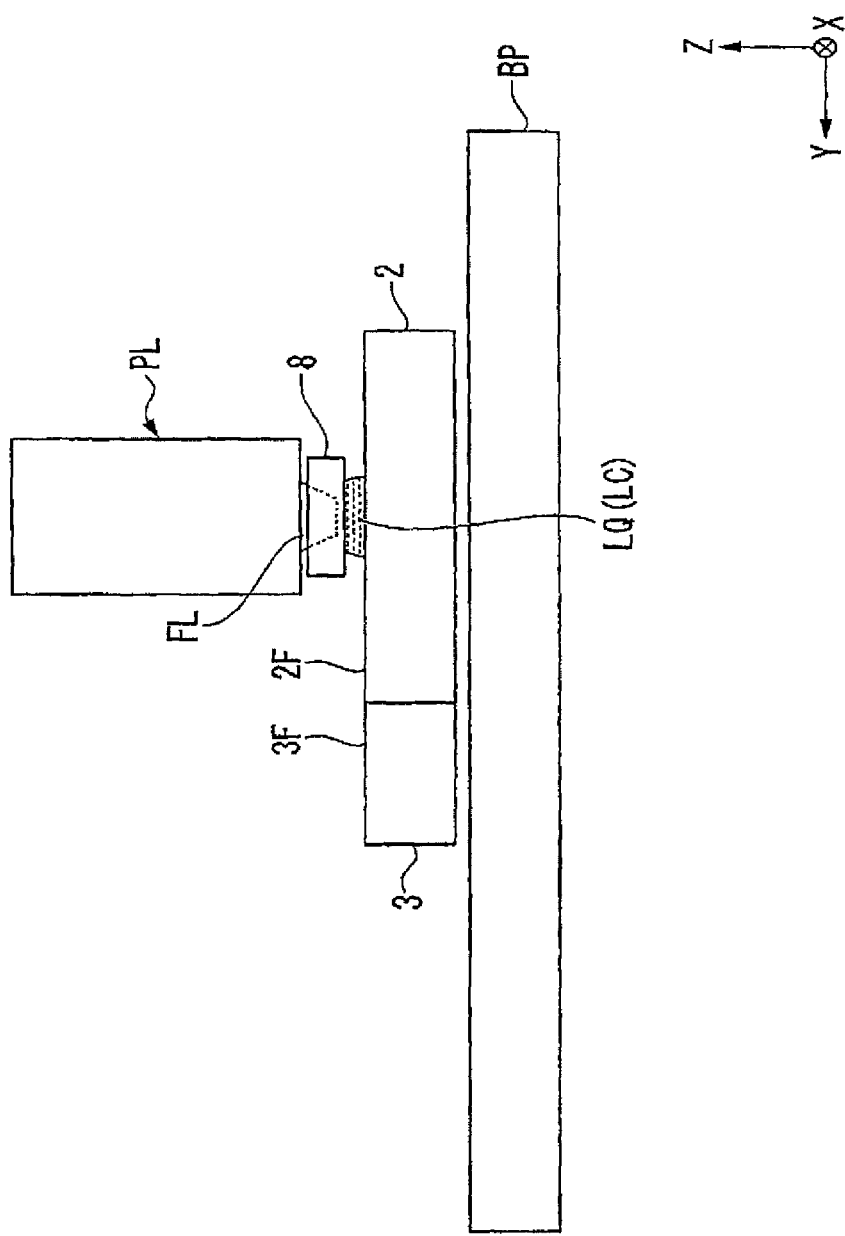
FIG. 7 is a view for explaining one example of the operation of the exposure apparatus.

The exposure apparatus EX of the present embodiment is capable of moving the immersion space between the upper surface 2F of the substrate stage 2 and the upper surface 3F of the measurement stage 3 by moving the substrate stage 2 and the measurement stage 3 together in the X and Y directions within a prescribed area that includes a position (a position that is directly below the projection optical system PL) that opposes the light emergent surface of the projection optical system PL (the last optical element FL) with respect to the last optical element FL and the nozzle member 8 in a state wherein the upper surface 2F of the substrate stage 2 and the upper surface 3F of the measurement stage 3 are brought proximate to or in contact with one another, as shown in the schematic drawing of FIG. 7. Accordingly, after the prescribed measurement operation is performed using the measurement stage 3, it is possible to cause the nozzle member 8 and the substrate stage 2 to oppose one another while maintaining the state wherein the immersion space is formed (i.e., the state wherein the last optical element FL contacts the exposure liquid LQ). Furthermore, the details of the operation that moves the immersion space between the upper surface 2F of the substrate stage 2 and the upper surface 3F of the measurement stage 3 is disclosed in, for example, PCT International Publication No. WO 2005/074014 (corresponding European Patent Application, Publication No. 1,713,113).

The control apparatus 7 exposes the substrate P by irradiating the substrate P with the exposure light EL through the immersion space, which is formed with the exposure liquid LQ. The control apparatus 7 causes the measurement stage 3 to oppose the nozzle member 8 by moving the substrate stage 2 and the measurement stage 3 together in the X and Y directions with respect to the last optical element FL and the nozzle member 8 in a state wherein the upper surface 2F of the substrate stage 2 and the upper surface 3F of the measurement stage 3 are brought proximate to or in contact with one another after the exposure of the substrate P is complete. Thereby, the immersion space is formed between the nozzle member 8 and the measurement stage 3.

Furthermore, the control apparatus 7 moves the substrate stage 2, which holds the exposed substrate P, to a prescribed substrate exchange position, unloads the exposed substrate P from the substrate stage 2, and loads the next substrate P to be exposed onto the substrate stage 2. In addition, during the exchange of the substrates at the substrate exchange position, the control apparatus 7 performs the measurement operation through the exposure liquid LQ using the measurement stage 3. After the loading of the next substrate P onto the substrate stage 2 is complete, the control apparatus 7 causes the substrate stage 2 to oppose the nozzle member 8 by moving the substrate stage 2 and the measurement stage 3 together in the X and Y directions while maintaining the immersion space, the same as discussed above, and starts the exposure of the next substrate P.

Furthermore, the control apparatus 7 performs the operations discussed above repetitively to sequentially expose a plurality of substrates P.

During the exposure of the substrate P, the exposure liquid LQ contacts the lower surface of the last optical element FL and the lower surface of the nozzle member 8. In addition, the exposure liquid LQ contacts the substrate stage 2 and the measurement stage 3.

If these members that contact the exposure liquid LQ are contaminated, then there is a possibility that the exposure liquid LQ that contacts these members will become contaminated.

For example, if foreign matter adheres to these members, then there is a possibility that the foreign matter will be mixed into the exposure liquid LQ. If the exposure liquid LQ becomes contaminated, then there is a possibility that the substrate P that contacts the exposure liquid LQ will become contaminated, which will affect exposure accuracy (e.g., cause defects in the pattern formed on the substrate P), and thereby the performance of the exposure apparatus EX will degrade.

In particular, if the substrate stage 2 that holds the substrate P is left in a contaminated state, then there is a possibility that pattern defects will extend to a plurality of substrates P, thereby increasing the damage.

In addition, if the measurement stage 3 is left in a contaminated state, then there is a possibility that the accuracy of measurements performed by the measuring instruments that are installed on that measurement stage 3 will deteriorate and affect the exposure operation, which is performed based on the results of those measurements.

In the present embodiment, the members of the exposure apparatus EX that contact the exposure liquid LQ can be cleaned, which makes it possible to prevent a deterioration in measurement accuracy caused by the contamination of the exposure apparatus EX members, deterioration of the exposure accuracy, and the occurrence of pattern defects.

The exposure apparatus EX performs the operation of cleaning the members that contact the exposure liquid LQ using the cleaning liquid LC that is supplied by the cleaning liquid producing apparatus 20 through the piping system 30 and the connection mechanism EC.

The exposure apparatus EX uses the nozzle member 8 to form the immersion space using the cleaning liquid LC that is supplied from the cleaning liquid producing apparatus 20 and cleans at least one of the last optical element FL, the nozzle member 8, the substrate stage 2, and the measurement stage 3 with the cleaning liquid LC of the immersion space.

The following explains one example of the operation wherein the cleaning liquid LC is used to clean at least part of the exposure apparatus EX. Although the exposure apparatus EX can use the cleaning liquid LC to clean at least one of the last optical element FL, the nozzle member 8, the substrate stage 2, and the measurement stage 3, which contact the exposure liquid LQ, the following explains an exemplary case wherein the cleaning liquid LC is used principally to clean the substrate stage 2.

As discussed above, the exposure apparatus EX comprises the detection apparatus 80, which detects the quality of the exposure liquid LQ that is recovered from the immersion space, which is formed with the exposure liquid LQ so that the optical path space of the exposure light EL is filled, via the recovery port 82. The control apparatus 7 uses the detection apparatus 80 to detect the quality (the water quality) of the exposure liquid LQ that is recovered via the recovery port 82 and determines whether to perform the cleaning operation with the cleaning liquid LC based on the detection results of the detection apparatus 80.

As shown in FIG. 6, the detection apparatus 80 comprises: the TOC meter 80A, which measures the total organic carbon in the exposure liquid LQ, the particle counter 80B, which detects foreign matter (particles) in the exposure liquid LQ, and the specific resistance meter 80C, which measures the specific resistance of the exposure liquid LQ; in addition, the detection apparatus 80 is capable of detecting the contamination state of the exposure liquid LQ after it contacts the substrate stage 2 and is recovered via the recovery port 82. The control apparatus 7 uses the detection apparatus 80 to detect the contamination state of the exposure liquid LQ that is recovered via the recovery port 82 while forming the immersion space between the last optical element FL and the nozzle member 8 on one side and the substrate stage 2 on the other side using the exposure liquid LQ. If, based on the detection results of the detection apparatus 80, it is determined that the exposure liquid LQ that contacted the substrate stage 2 has been contaminated, then the cleaning operation is performed with the cleaning liquid LC.

The contamination state of the exposure liquid LQ that is recovered via the recovery port 82 varies in accordance with the contamination state of the substrate stage 2, and therefore it is possible to detect (estimate) the contamination state of the substrate stage 2 based on the detection results of the detection apparatus 80.

If it is determined, based on the detection results of the detection apparatus 80, that the contamination state of the upper surface 2F of the substrate stage 2 is within a permissible range, then the control apparatus 7 continues the normal exposure operation (exposure sequence) without performing the cleaning operation. However, if it is determined, based on the detection results of the detection apparatus 80, that the contamination state of the upper surface 2F of the substrate stage 2 is not within the permissible range, then the control apparatus 7 performs the cleaning operation using the cleaning liquid LC.

The present embodiment explained an exemplary case wherein the particle counter 80B of the detection apparatus 80 is used to detect the amount (number) of foreign matter (particles) in the exposure liquid LQ that is recovered via the recovery port 82, and the cleaning operation using the cleaning liquid LC is controlled based on that detection result. Of course, it is also acceptable to determine whether to perform the cleaning operation based on the measurement results of, for example, the TOC meter 80A and/or the specific resistance meter 80C.

If it is determined, based on the detection result of the particle counter 80B, that the amount (number) of foreign matter (particles) in the exposure liquid LQ that is recovered via the recovery port 82 is not within the permissible range, then the cleaning operation using the cleaning liquid LC is started. First, the control apparatus 7 stops the supply of the exposure liquid LQ via the supply port 81 of the nozzle member 8, and recovers the exposure liquid LQ from the immersion space via the recovery port 82 so as to eliminate the exposure liquid LQ completely from the space between the last optical element FL and the nozzle member 8 on one side and the substrate stage 2 on the other side.

In addition, the first valve mechanism 34 and the second valve mechanism 35 are set to the second mode. Thereby, the liquid generating system LS supplies the cleaning liquid LC to the exposure apparatus EX through the piping system 30 and the connection mechanism EC.

The control apparatus 7 starts the operation of forming the immersion space between the last optical element FL and the nozzle member 8 on one side and the substrate stage 2 on the other side using the cleaning liquid LC that is supplied by the liquid generating system LS. The cleaning liquid LC that is supplied by the liquid generating system LS is supplied through the supply pipe 85 and the supply passageway 84 of the nozzle member 8 to the supply port 81. The supply port 81 of the nozzle member 8 supplies the cleaning liquid LC that is fed from the liquid generating system LS to the substrate stage 2, which is the cleaning target member.

In addition, the recovery port 82 of the nozzle member 8 recovers the cleaning liquid LC, which is supplied via the supply port 81, after it has contacted the substrate stage 2, which is the cleaning target member. The cleaning liquid LC that was recovered via the recovery port 82 is then recovered by the liquid recovery apparatus 89 through the recovery passageway 87 of the nozzle member 8 and the recovery pipe 88.

In the present embodiment, the control apparatus 7 performs the operation of supplying the cleaning liquid LC via the supply port 81 and the operation of recovering the cleaning liquid LC via the recovery port 82 in parallel. Thereby, the immersion space of the cleaning liquid LC is formed between the last optical element FL and the nozzle member 8 on one side and the substrate stage 2 on the other side. The substrate stage 2 is cleaned by contacting the cleaning liquid LC. Furthermore, as discussed above, the upper surface 2F of the substrate stage 2 is liquid repellent with respect to the exposure liquid LQ, and therefore is also liquid repellent with respect to the cleaning liquid LC, wherein nitrogen has been dissolved in the exposure liquid LQ. Accordingly, it is possible to locally form the immersion space of the cleaning liquid LC between the last optical element FL and the nozzle member 8 on one side and the substrate stage 2 on the other side.

Here, with the cleaning operation that uses the cleaning liquid LC, a clean dummy substrate DP that is separate from the exposure substrate P and tends not to emit foreign matter is held by the substrate holder 2H of the substrate stage 2. The dummy substrate DP has an outer shape that is substantially the same as that of the exposure substrate P and can be held by the substrate holder 2H. In the present embodiment, the substrate holder 2H has a so-called pin chuck mechanism and thereby detachably holds the substrate P and the dummy substrate DP. In this case, the front surface of the dummy substrate DP is preferably liquid repellent with respect to the cleaning liquid LC (the contact angle of the front surface of the dummy substrate DP and the cleaning liquid LC is greater than or equal to 80°). Making the front surface of the dummy substrate DP liquid repellent in advance makes it possible to suppress the spread of the cleaning liquid LC even if the cleaning liquid LC contacts part of the front surface of the dummy substrate DP.

Furthermore, it is also possible to perform the cleaning operation using the cleaning liquid LC in a state wherein the substrate holder 2H is exposed—without the dummy substrate DP being held by the substrate holder 2H. In so doing, the cleaning liquid LC naturally contacts the upper surface 2F of the substrate stage 2 as well as the substrate holder 2H, and thereby the substrate holder 2H can be cleaned satisfactorily.

In addition, the cleaning liquid LC that is supplied via the supply port 81 also contacts the last optical element FL and the nozzle member 8. The last optical element FL and the nozzle member 8 are also cleaned by their contact with the cleaning liquid LC.

In addition, in the present embodiment, the control apparatus 7 uses the drive mechanism 5 to move the substrate stage 2 in the X and Y directions with respect to the nozzle member 8 in a state wherein the immersion space is formed between the nozzle member 8 and the substrate stage 2 using the cleaning liquid LC. Thereby, a large area of the upper surface 2F of the substrate stage 2 can be cleaned.

The operation of supplying the cleaning liquid LC via the supply port 81 and the operation of recovering the cleaning liquid LC via the recovery port 82 are performed in parallel, even when the substrate stage 2 is moved with respect to the nozzle member 8 in the state wherein the immersion space is formed using the cleaning liquid LC.

After performing the cleaning operation using the cleaning liquid LC for a prescribed time, the control apparatus 7 eliminates the immersion space by stopping the operation of supplying the cleaning liquid LC via the supply port 81 of the nozzle member 8 and recovering the cleaning liquid LC of the immersion space using the recovery port 82 of the nozzle member 8, Thereby, the cleaning operation that uses the cleaning liquid LC is completed.

Subsequently, the first valve mechanism 34 and the second valve mechanism 35 are set to the first mode, and the normal exposure operation (exposure sequence) starts. Furthermore, before the exposure operation starts, it is preferable that the supply and recovery of the exposure liquid LQ continue for a prescribed time so that the cleaning liquid LC is sufficiently discharged from, for example, the fifth passageway 39 and the supply pipe 85. In addition, there is also a possibility that the exposure liquid LQ that flowed in prior to the performance of the cleaning operation will remain in the fourth passageway 36, and there is a risk that members of the exposure apparatus EX, such as the nozzle member 8, will become contaminated if the exposure liquid LQ is supplied thereto through the supply pipe 85, in which case a passageway may be separately provided in order to discharge the exposure liquid LQ that is inside the fourth passageway 36.

As discussed above, the cleaning liquid LC of the present embodiment is produced by dissolving the prescribed gas (nitrogen) of an amount that is greater than or equal to the saturation concentration under atmospheric pressure in the exposure liquid LQ, and therefore is in a supersaturated state. Accordingly, if the pressure that is applied to the cleaning liquid LC drops, then microbubbles are generated in the cleaning liquid LC. In the present embodiment, so-called microbubbles are generated in the cleaning liquid LC that is supplied via the supply port 81. The microbubbles include bubbles that have a diameter of less than ten to several tens of microns.

Microbubbles and/or bubbles of a larger size have a function that removes (strips) foreign matter (contaminants) that are adhered to the surfaces of the members; consequently, foreign matter that adheres to the cleaning target members can be removed effectively by supplying the cleaning liquid LC that is in a supersaturated state to the exposure apparatus EX using the liquid generating system LS and generating microbubbles and/or bubbles of a larger size in the vicinity of the cleaning target members of the exposure apparatus EX.

As discussed above, in the present embodiment, the pressure adjustment mechanism 9 is disposed in part of the supply pipe 85 and the exposure apparatus EX adjusts the pressure that is applied to the cleaning liquid LC inside the passageway between the cleaning liquid producing apparatus 20 and the pressure adjustment mechanism 9 so that bubbles are not generated in the cleaning liquid LC inside the passageway between the cleaning liquid producing apparatus 20 and the pressure adjustment mechanism 9, and so that microbubbles and/or bubbles of a larger size are generated in the cleaning liquid LC at a desired position (space).

Furthermore, the pressure applied to the cleaning liquid LC inside the passageway between the pressure adjustment mechanism 9 and the supply port 81 (the passageway in the vicinity of the supply port 81) is preferably reduced to approximately 0.2-0.8 times that of the pressure that is applied to the cleaning liquid LC between the cleaning liquid producing apparatus 20 and the pressure adjustment mechanism 9.

In the present embodiment, the pressure that is applied to the cleaning liquid LC inside the passageway between the cleaning liquid producing apparatus 20 and the pressure adjustment mechanism 9 is adjusted so that microbubbles and/or bubbles of a larger size are generated in the cleaning liquid LC in the vicinity of the supply port 81. The microbubbles and/or bubbles of a larger size in the cleaning liquid LC are preferably generated in the vicinity of the cleaning target member, e.g., the substrate stage 2. Accordingly, it is possible to obtain a strong cleaning effect by generating microbubbles and/or bubbles of a larger size in the cleaning liquid LC in the vicinity of the supply port 81. Furthermore, the pressure that is applied to the cleaning liquid LC between the cleaning liquid producing apparatus 20 and the pressure adjustment mechanism 9 may be adjusted so that microbubbles and/or bubbles of a larger size are generated inside the passageway 84 of the nozzle member 8.

In addition, if the passageway from the pressure adjustment mechanism 9 to the supply port 81 is long, then it is difficult to control the position (space) at which the microbubbles and/or bubbles of a larger size are generated in the cleaning liquid LC, and it is therefore preferable to provide the pressure adjustment mechanism 9 in the passageway immediately before the nozzle member 8 at a position that is as close as possible to the supply port 81.

Furthermore, a sensor that measures the pressure that is applied to the cleaning liquid LC may be disposed in the passageway between the cleaning liquid producing apparatus 20 and the pressure adjustment mechanism 9, and the pressure adjustment mechanism 9 may be controlled based on the measurement result of this pressure sensor. Furthermore, a sensor may be disposed that measures the pressure of the cleaning liquid LC in the passageway between the pressure adjustment mechanism 9 and the supply port 81, and the pressure adjustment mechanism 9 may be controlled based on the measurement result thereof.

Furthermore, it is also possible to use a supply amount adjustment apparatus of the cleaning liquid producing apparatus 20 to adjust the pressure that is applied to the cleaning liquid LC inside the passageway between the cleaning liquid producing apparatus 20 and the pressure adjustment mechanism 9 based on, for example, the flow volume per unit of time of the supersaturated cleaning liquid LC that is supplied from the cleaning liquid producing apparatus 20. Accordingly, the pressure that is applied to the cleaning liquid LC may be adjusted using both the supply amount adjustment apparatus of the cleaning liquid producing apparatus 20 and the pressure adjustment mechanism 9.

In addition, as discussed above, the cleaning liquid LC of the present embodiment contains an alkali (ammonia). The alkali has a function that prevents the foreign matter (contaminants) that was stripped from the cleaning target members of the exposure apparatus EX from re-adhering to the cleaning target members, which makes it possible to increase the cleaning effect of the cleaning liquid LC.

In addition, in the present embodiment, the operation of supplying the cleaning liquid LC via the supply port 81 and the operation of recovering the cleaning liquid LC via the recovery port 82 are performed in parallel, and therefore fresh cleaning liquid LC is supplied via the supply port 81 to the cleaning target members continuously and the foreign matter that is removed (stripped) from the cleaning target members is recovered along with the cleaning liquid LC via the recovery port 82. Thereby, the re-adherence of the foreign matter to the cleaning target members is prevented.

The following explains an experiment that was conducted to verify the cleaning effect that is produced by the cleaning operation that uses the cleaning liquid, and the result thereof. In the experiment, the immersion space was formed using the exposure liquid LQ: before the cleaning operation; after the cleaning operation wherein a first cleaning liquid was used; and after the cleaning operation wherein a second cleaning liquid was used; in addition, the detection apparatus 80 was used to detect the foreign matter (particles) in the exposure liquid LQ that was recovered from the immersion space via the recovery port 82. Here, the first cleaning liquid was pure water, in which nitrogen of an amount that is greater than or equal to the saturation concentration under atmospheric pressure was dissolved, and did not contain an alkali; the second cleaning liquid was pure water, in which nitrogen of an amount that is greater than or equal to the saturation concentration under atmospheric pressure was dissolved, and contained ammonia, which was the alkali.

Figure 8:
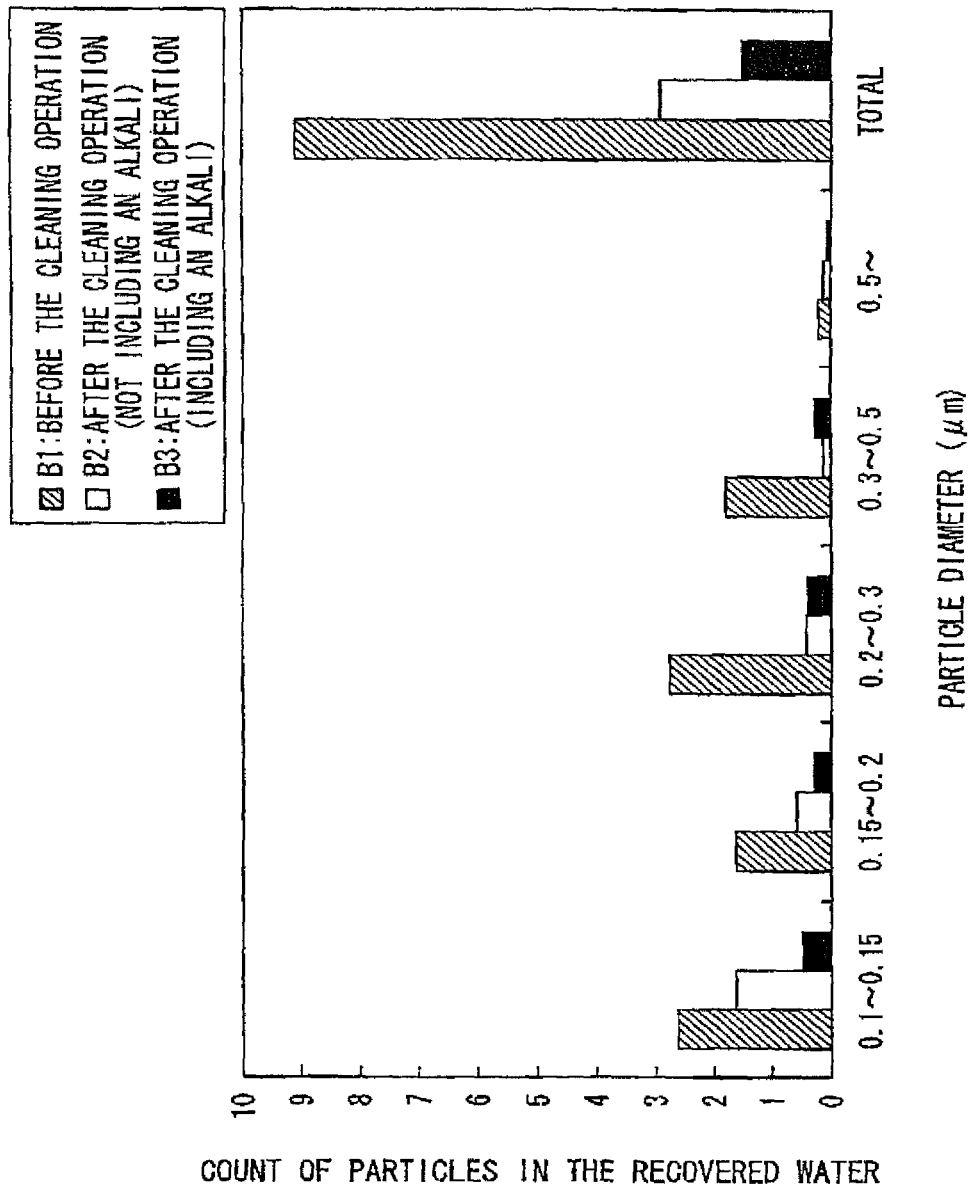
FIG. 8 is a view that shows the results of an experiment that was conducted in order to verify that the cleaning effect is produced by a cleaning operation that uses a cleaning liquid.

FIG. 8 is a graph that shows the results of the experiment. In FIG. 8, the abscissa of the graph represents the size of the particles (particle diameters) that were detected by the detection apparatus 80, and the ordinate represents the number of particles. In addition, in FIG. 8, bar B1 represents the result of detecting particles in the exposure liquid LQ before the cleaning operation, bar B2 represents the result of detecting particles in the exposure liquid LQ after the cleaning operation wherein the first cleaning liquid was used, and bar B3 represents the result of detecting particles in the exposure liquid LQ after the cleaning operation wherein the second cleaning liquid was used.

As can be seen in FIG. 8, it was confirmed that the number of particles in the exposure liquid LQ was sufficiently reduced after the cleaning operations wherein the first and second cleaning liquids were used, even if there were numerous particles in the exposure liquid LQ before the cleaning operation was performed.

In addition, after the cleaning operation wherein the first cleaning liquid was used, the number of particles of a comparatively large size (particles with a diameter of 0.2 µm or greater) were sufficiently reduced, but particles of a comparatively small size (particles with a diameter of less than 0.2 µm) were not sufficiently reduced. However, after the cleaning operation wherein the second cleaning liquid was used, particles of a comparatively large size (particles with a diameter of 0.2 µm or greater) and of a comparatively small size (particles with a diameter of less than 0.2 µm) were both sufficiently reduced. Thus, the use of the second cleaning liquid, which contained an alkali (ammonia), made it possible to reduce the number of particles sufficiently, regardless of their size. In addition, based on these results, it can be assumed that the use of the second cleaning liquid, which contains an alkali (ammonia) makes it possible to prevent the particles from re-adhering to the members.

As explained above, according to the present embodiment, it is possible to use the cleaning liquid LC, in which a prescribed gas of an amount that is greater than or equal to the saturation concentration under atmospheric pressure has been dissolved, to clean the members of the exposure apparatus EX efficiently and satisfactorily. Accordingly, it is possible to prevent deterioration in the performance of the exposure apparatus EX that is caused by the contamination of the members that constitute the exposure apparatus EX. Accordingly, it is possible to expose the substrate P satisfactorily and fabricate devices that have a desired performance.

When cleaning the members of the exposure apparatus, the conventional method that, for example, disassembles the exposure apparatus and removes the members to be cleaned requires that the operation of the exposure apparatus EX be stopped for a long period of time, which leads to a decrease in the operating ratio of the exposure apparatus EX. In the present embodiment, the members of the exposure apparatus EX can be cleaned efficiently and satisfactorily without having to remove them.

In addition, according to the present embodiment, the cleaning liquid LC is the exposure liquid LQ in which the prescribed gas has been dissolved, which makes it possible not only to perform the cleaning operation with a desired timing, but also to perform the exposure operation a short time after the cleaning operation and thereby to prevent a decrease in the operating ratio of the exposure apparatus EX. In addition, the members that contact the cleaning liquid LC are not affected adversely. Furthermore, the ammonia content (ammonia concentration) is preferably 0.01-10.00 mg/l, and, more preferably, approximately 0.05-5.00 mg/l.

For example, if a liquid (a chemical solution) other than the exposure liquid LQ is used as the cleaning liquid, then it is necessary to perform a process (e.g., a flushing process) after the cleaning operation is performed in order to eliminate the chemical solution that adheres to (remains on) the surfaces of the members sufficiently. In addition, specialized equipment will be needed to process the chemical solution. According to the present embodiment, the cleaning liquid LC is the exposure liquid LQ in which the prescribed gas is dissolved, which makes it possible to reduce the time needed to perform the flushing process sufficiently after the cleaning operation is performed. In addition, even if the cleaning liquid LC contains an alkali, the amount thereof is minute, which makes it possible to reduce the time needed to perform the flushing process after the cleaning operation is performed. Accordingly, it is possible to prevent a decrease in the operating ratio of the exposure apparatus EX. In addition, ammonia, which serves as the alkali, easily vaporizes in the state wherein there is no water, which makes it possible to eliminate the ammonia containing cleaning liquid LC that remains on the surfaces of the members quickly by performing a drying process thereon after they have contacted the cleaning liquid LC.

Furthermore, the above explained a case wherein, principally, the substrate stage 2 is cleaned, but the measurement stage 3 may be cleaned by forming the immersion space with the cleaning liquid LC between the last optical element FL and the nozzle member 8 on one side and the measurement stage 3 on the other side. For example, as explained referencing FIG. 7, large areas of both the substrate stage 2 and the measurement stage 3 may be cleaned using the cleaning liquid LC by moving the substrate stage 2 and the measurement stage 3 together in the X and Y directions with respect to the nozzle member 8 in the state wherein the upper surface 2F of the substrate stage 2 and the upper surface 3F of the measurement stage 3 are brought proximate to or in contact with one another. In this case, the immersion space may be formed between the last optical element FL and the nozzle member 8 on one side and the measurement stage 3 on the other side using the exposure liquid LQ, the contamination state of the exposure liquid LQ that is recovered via the recovery port 82 may be examined using the detection apparatus 80, and, based on the result thereof, a determination as to whether to clean the measurement stage 3 may be made.

In addition, in the explanation above, the last optical element FL and the nozzle member 8 are cleaned together with the substrate stage 2, but just the last optical element FL and the nozzle member 8 may be cleaned by, for example, forming the immersion space between a clean dummy substrate DP on one side and the last optical element FL and the nozzle member 8 on the other side using the cleaning liquid LC. In this case, the immersion space may be formed between the last optical element FL and the nozzle member 8 on one side and the dummy substrate DP on the other side using the exposure liquid LQ, the contamination state of the exposure liquid LQ that is recovered via the recovery port 82 may be examined using the detection apparatus 80, and, based on the result thereof, a determination as to whether to clean the last optical element FL and the nozzle member 8 may be made.

In addition, in the explanation above, the exposure liquid LQ is eliminated from the optical path space of the exposure light EL before the supply of the cleaning liquid LC is started, but the exposure liquid LQ may be exchanged with the cleaning liquid LC by changing the mode from the first mode to the second mode in the state wherein the immersion space of the exposure liquid LQ is formed, and then starting the supply of the cleaning liquid LC. In addition, in the same manner as after the cleaning is completed, the cleaning liquid LC may be exchanged with the exposure liquid LQ by changing the mode from the second mode to the first mode in the state wherein the optical path space is filled with the cleaning liquid LC, and then starting the supply of the exposure liquid LQ.

In addition, in the above explanation, the cleaning operation was completed by stopping the supply of the cleaning liquid LC after the cleaning operation using the cleaning liquid LC was performed for a prescribed time; however, if it is possible to verify the contamination state of the cleaning liquid LC using the detection apparatus 80, then, based on the detection result of the detection apparatus 80, the cleaning operation may be terminated after the degree of contamination of the cleaning liquid LC falls below a permissible value.

In addition, in the above explanation, the cleaning liquid producing apparatus 20 is connected to the piping system 30 of the exposure apparatus EX, but the cleaning liquid producing apparatus 20 may be detachable. For example, the cleaning liquid producing apparatus 20 may be connected to the piping system 30 when the operator of the exposure apparatus EX is performing cleaning.

In addition, in the explanation above, the exposure liquid producing apparatus 10 is connected to the piping system 30 of the exposure apparatus EX, but the exposure liquid producing apparatus 10 may be equipment at, for example, the plant at which the exposure apparatus EX is installed. Namely, the exposure liquid LQ may be supplied directly to the piping system 30 from, for example, the plant at which the exposure apparatus EX is installed.

In addition, if an observation camera (an imaging device) for sensing the state of the immersion space that is formed below the last optical element FL is installed in the measurement stage 3, as disclosed in, for example, PCT International Publication No. WO 2006/013806 (corresponding European Patent Application, Publication No. 1,791,164), then the immersion space may be formed between the last optical element FL and the nozzle member 8 on one side and the measurement stage 3 on the other side using the cleaning liquid LC, the generation state of the microbubbles and/or bubbles of a larger size inside the cleaning liquid LC may be detected, and, based on the result thereof, the pressure adjustment mechanism 9 and the like may be controlled. In addition, the atmospheric pressure inside the chamber wherein the immersion space of the cleaning liquid LC is formed varies in accordance with the location at which the exposure apparatus EX is installed. For example, the atmospheric pressure of the chamber CH varies depending on the altitude of the location at which the exposure apparatus EX is installed, and there is a possibility that the generation of microbubbles or bubbles of a larger size inside the cleaning liquid LC may not reach a desired state. In such a case, it is preferable to control, for example, the pressure adjustment mechanism 9 so as to optimize the pressure that is applied to the cleaning liquid LC between the cleaning liquid producing apparatus 20 and the pressure adjustment mechanism 9 in accordance with the atmospheric pressure inside the chamber CH. Furthermore, if the exposure apparatus EX is equipped with a sensor that measures the atmospheric pressure inside the chamber CH, then, for example, the pressure adjustment mechanism 9 may be controlled based on the measurement result of that atmospheric pressure sensor.

Second Embodiment

The following explains a second embodiment. In the explanation below, constituent parts that are identical or equivalent to those in the embodiment discussed above are assigned identical symbols, and the explanations thereof are therefore abbreviated or omitted. In addition, the explanations of operations that are identical or equivalent to those in the embodiment discussed above are abbreviated or omitted.

Figure 9:
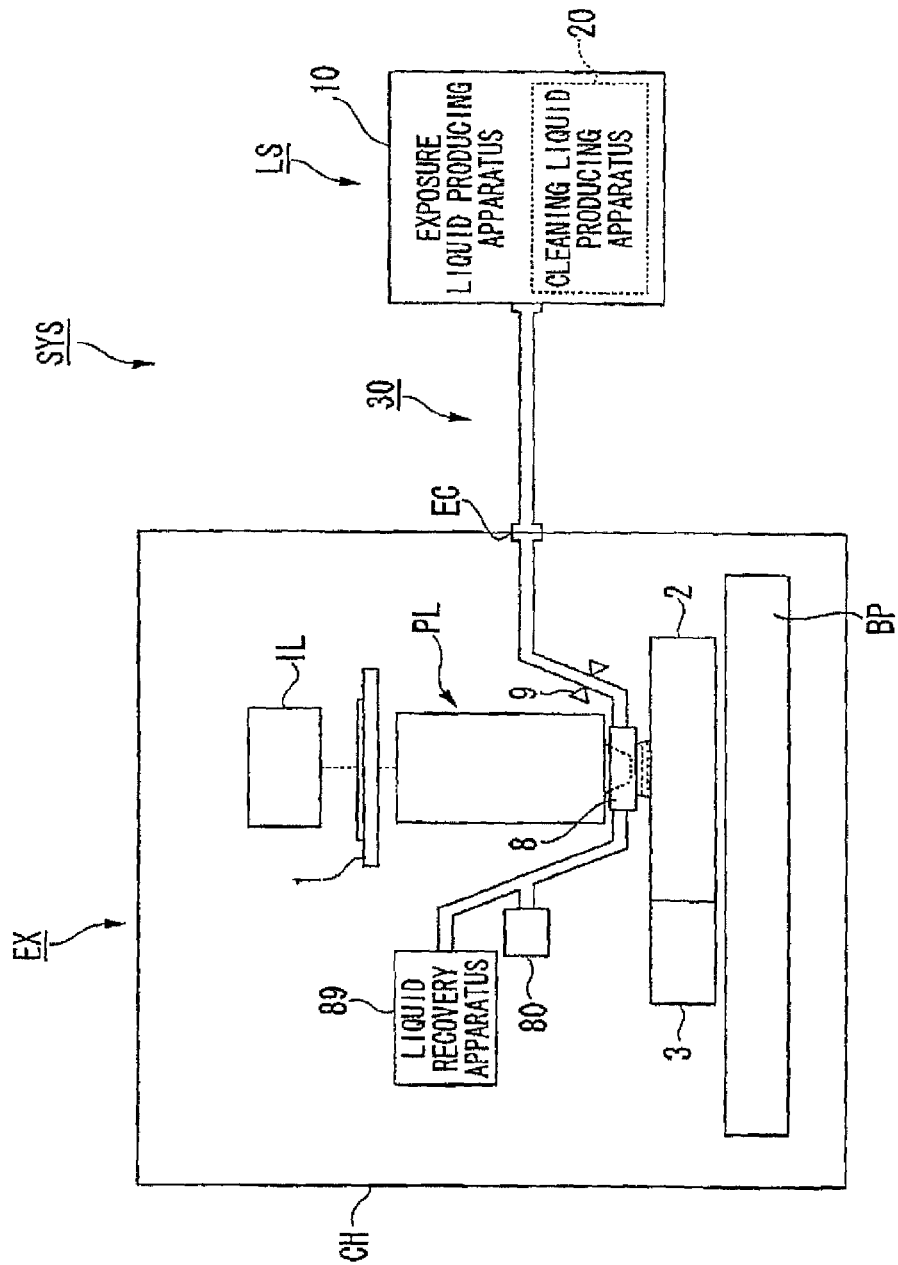
FIG. 9 is a schematic block diagram that shows the device fabrication system according to a second embodiment.

FIG. 9 shows an exposure system SYS according to the second embodiment. As shown in FIG. 9, the liquid generating system LS comprises the exposure liquid producing apparatus 10, which produces the exposure liquid LQ, and the cleaning liquid producing apparatus 20, which generates the cleaning liquid LC. In the present embodiment, the cleaning liquid producing apparatus 20 is disposed inside the exposure liquid producing apparatus 10.

According to the present embodiment, the piping system 30 of the exposure apparatus EX can be simplified.

Furthermore, in the first and second embodiments discussed above, the cleaning liquid LC is supplied from one cleaning liquid producing apparatus 20 to one exposure apparatus, but it may be supplied from one cleaning liquid producing apparatus 20 to a plurality of exposure apparatuses.

Third Embodiment

The following explains a third embodiment. In the explanation below, constituent parts that are identical or equivalent to those in the embodiments discussed above are assigned identical symbols, and the explanations thereof are therefore abbreviated or omitted. In addition, the explanations of operations that are identical or equivalent to those in the embodiments discussed above are abbreviated or omitted. The characteristic portion of the third embodiment is that the exposure apparatus EX comprises a cleaning liquid producing apparatus 20E that generates the cleaning liquid LC.

Figure 10:
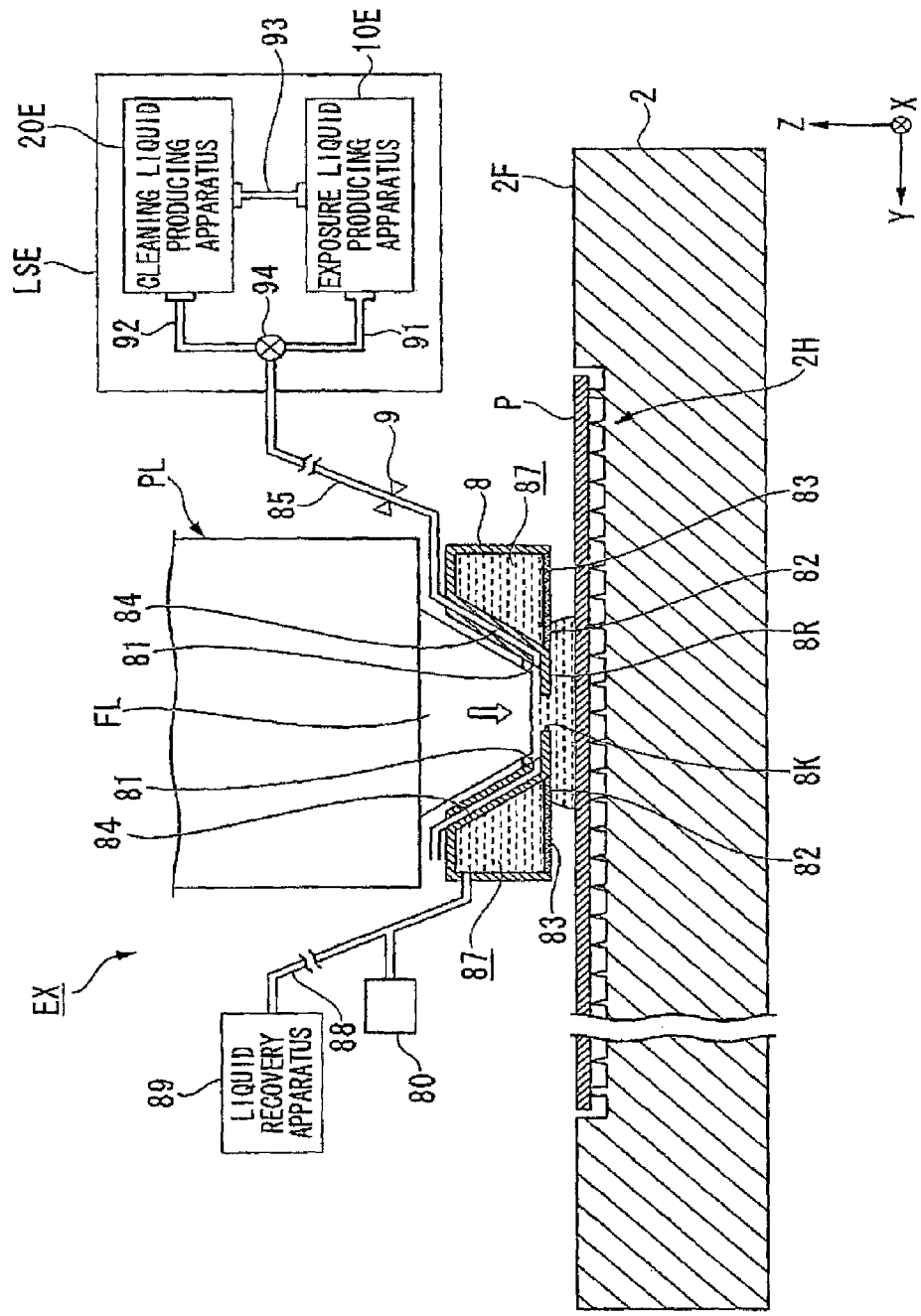
FIG. 10 is a schematic block diagram that shows the exposure apparatus according to a third embodiment.

FIG. 10 shows an exposure apparatus EX according to the third embodiment. In FIG. 10, the exposure apparatus EX comprises a liquid supply apparatus LSE that supplies the liquid through the supply pipe 85 to the supply port 81 of the nozzle member 8. The liquid supply apparatus LSE comprises the cleaning liquid producing apparatus 20E that generates the cleaning liquid LC. In addition, in the present embodiment, the liquid supply apparatus LSE comprises an exposure liquid producing apparatus 10E that produces the exposure liquid LQ.

In addition, the liquid supply apparatus LSE comprises a first passageway 91 that connects the supply pipe 85 and the exposure liquid producing apparatus 10E, a second passageway 92 that connects the supply pipe 85 and the cleaning liquid producing apparatus 20E, and a third passageway 93 that connects the exposure liquid producing apparatus 10E and the cleaning liquid producing apparatus 20E. In addition, the liquid supply apparatus LSE comprises a passageway switching mechanism (valve mechanism) 94 that is disposed at the connecting part where the supply pipe 85, the first passageway 91, and the second passageway 92 connect.

The exposure liquid LQ that is fed by the exposure liquid producing apparatus 10E can reach the supply pipe 85 through the first passageway 91. In addition, in the present embodiment, the cleaning liquid producing apparatus 20E is disposed on the downstream side of the exposure liquid producing apparatus 10E, and the exposure liquid LQ that is fed by the exposure liquid producing apparatus 10E is supplied to the cleaning liquid producing apparatus 20E through the third passageway 93. The cleaning liquid LC that is fed by the cleaning liquid producing apparatus 20E flows through the second passageway 92 and thereby can reach the supply pipe 85.

Figure 11A:
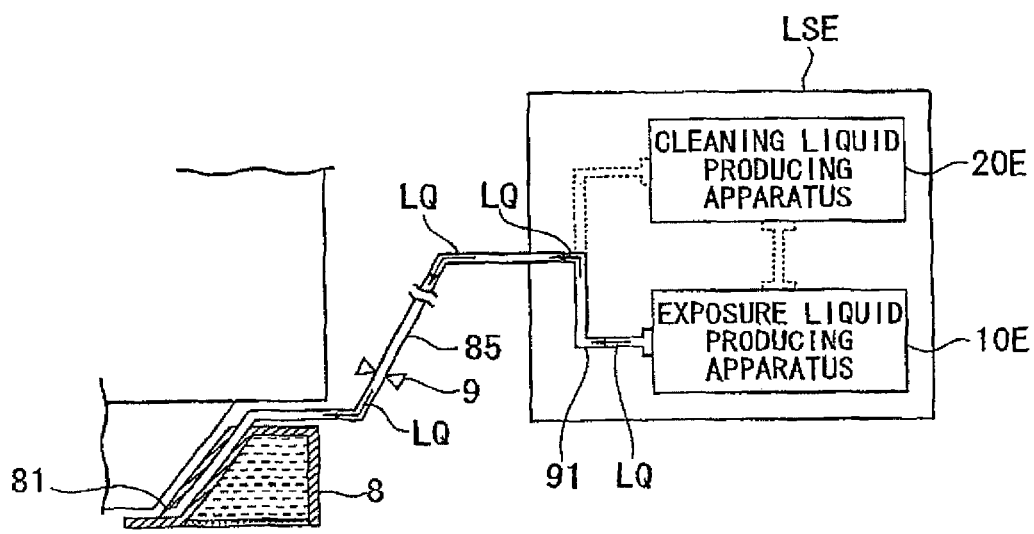
FIG. 11A is a view for explaining one example of the operation of a liquid supply apparatus according to a third embodiment.

FIG. 11A is a schematic drawing that shows the state wherein the liquid supply apparatus LSE supplies the exposure liquid LQ to the supply pipe 85. The control apparatus 7 controls the exposure liquid producing apparatus 10E as well as the valve mechanism 94 so as to establish a passageway such that the exposure liquid producing apparatus 10E and the supply pipe 85 are connected, and thereby can supply the exposure liquid LQ that is fed by the exposure liquid producing apparatus 10E through the first passageway 91 to the supply pipe 85, as shown in FIG. 11A. The exposure liquid LQ that is supplied to the supply pipe 85 is supplied to the supply port 81. The supply port 81 supplies the exposure liquid LQ in order to form the immersion space.

Figure 11B:
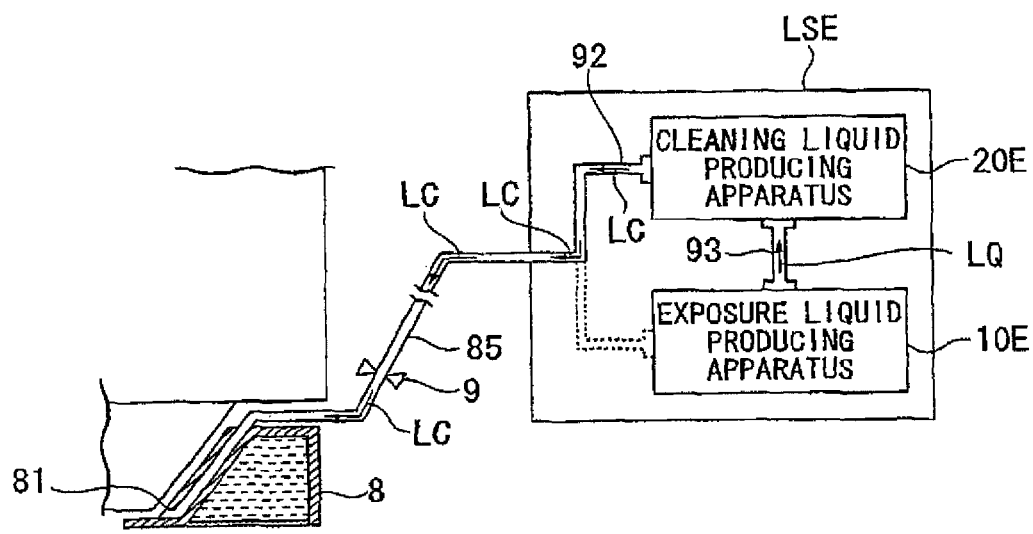
FIG. 11B is a view for explaining one example of the operation of a liquid supply apparatus according to a third embodiment.

FIG. 11B shows a state wherein the liquid supply apparatus LSE supplies the cleaning liquid LC to the supply pipe 85. The control apparatus 7 controls the exposure liquid producing apparatus 10E and can thereby supply the exposure liquid LQ that is fed by the exposure liquid producing apparatus 10E through the third passageway 93 to the cleaning liquid producing apparatus 20E, as shown in FIG. 11B. The exposure liquid LQ that is fed by the exposure liquid producing apparatus 10E flows through the third passageway 93 and is supplied to the cleaning liquid producing apparatus 20E.

In the same manner as the embodiments discussed above, the cleaning liquid producing apparatus 20E uses the exposure liquid LQ that is supplied by the exposure liquid producing apparatus 10E to generate the cleaning liquid LC.

In addition, the control apparatus 7 controls the valve mechanism 94 so as to establish a passageway such that the cleaning liquid producing apparatus 20E and the supply pipe 85 are connected, and thereby can supply the cleaning liquid LC that is fed by the cleaning liquid producing apparatus 20E through the second passageway 92 to the supply pipe 85, as shown in FIG. 11B. The cleaning liquid LC that is supplied to the supply pipe 85 is supplied to the supply port 81. The supply port 81 supplies the cleaning liquid LC in order to form the immersion space.

As explained above, the cleaning liquid producing apparatus 20E can be provided to the exposure apparatus EX. Furthermore, equipment at, for example, the plant at which the exposure apparatus EX is installed may be substituted for the exposure liquid producing apparatus 10E of the exposure apparatus EX (the liquid supply apparatus LSE).

Fourth Embodiment

The following explains a fourth embodiment. In the explanation below, constituent parts that are identical or equivalent to those in the embodiments discussed above are assigned identical symbols, and the explanations thereof are therefore abbreviated or omitted. In addition, the explanations of operations that are identical or equivalent to those of the embodiments discussed above are abbreviated or omitted.

Figure 12:
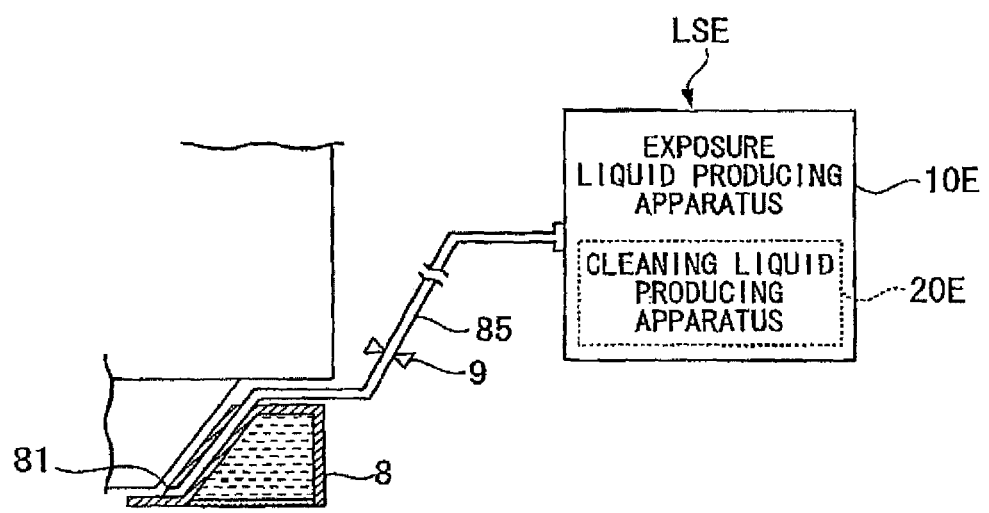
FIG. 12 is a schematic block diagram that shows the exposure apparatus according to a fourth embodiment.
Figure 13:
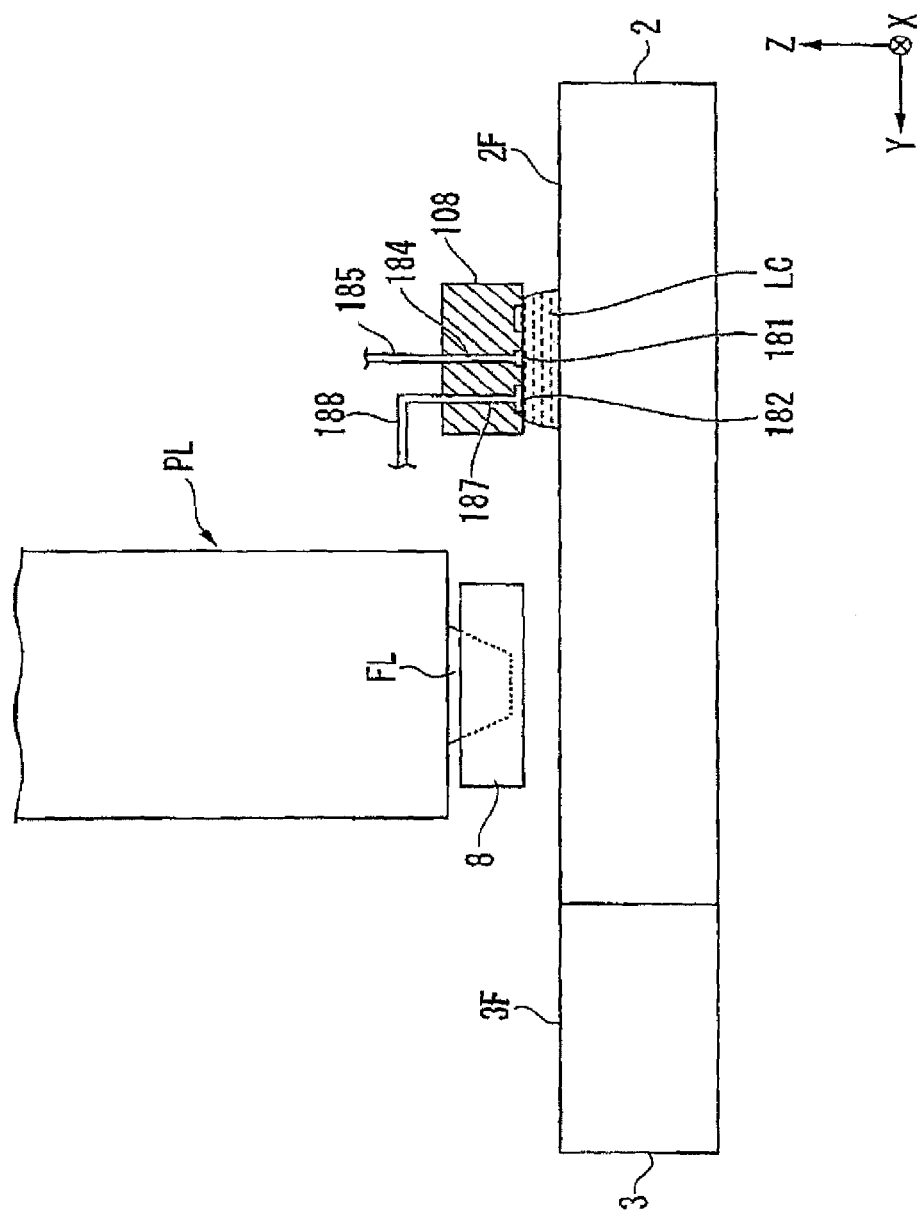
FIG. 13 is a schematic block diagram that shows the exposure apparatus according to a fifth embodiment.

FIG. 12 shows an exposure apparatus EX according to the fourth embodiment. As shown in FIG. 12, the liquid supply apparatus LSE of the exposure apparatus EX comprises the exposure liquid producing apparatus 10E, which produces the exposure liquid LQ, and the cleaning liquid producing apparatus 20E is disposed inside the exposure liquid producing apparatus 10E.

According to the present embodiment, the passageway of the liquid supply apparatus LSE can be simplified.

Furthermore, in the first through fourth embodiments discussed above, the amount of the cleaning liquid LC that is supplied per unit of time via the supply port 81 during the cleaning operation is greater than the amount of the exposure liquid LQ that is supplied per unit of time via the supply port 81 during the exposure operation. Thereby, it is possible, for example, to reduce the cleaning time.

In addition, in the first through fourth embodiments discussed above, the recovery apparatus for recovering the cleaning liquid LC via the recovery port 82 may be provided separately from the recovery apparatus for recovering the exposure liquid LQ.

In addition, it is preferable to recover the cleaning liquid LC with a recovery force (a suction force) that is larger than that of the recovery port 82 during the exposure of the substrate P in order to reliably discharge the particles that are removed during the cleaning operation and after cleaning is complete, and in order to prevent the leakage and dispersion of the cleaning liquid LC from the prescribed space.

In addition, in the first through fourth embodiments discussed above, a photochemical action (photocleaning effect) can be induced by irradiating the exposure light EL during the performance of the cleaning operation that uses the cleaning liquid LC.

Fifth Embodiment

The following explains the fifth embodiment. In the explanation below, constituent parts that are identical or equivalent to those in the embodiments discussed above are assigned identical symbols, and the explanations thereof are therefore abbreviated or omitted. In addition, the explanations of operations that are identical or equivalent to those of the embodiments discussed above are abbreviated or omitted. The characteristic portion of the present embodiment is that the exposure apparatus EX comprises a second nozzle member 108, which is disposed at a position that is spaced apart from the nozzle member 8 and is capable of forming the immersion space with the cleaning liquid LC.

The second nozzle member 108 is disposed at a position that is spaced apart from the nozzle member 8 and is capable of forming the immersion space with the cleaning liquid LC. The second nozzle member 108 has a lower surface and is capable of holding the cleaning liquid LC between that lower surface and an object (at least one of the upper surface 2F of the substrate stage 2, the substrate (P, DP) that is held by the substrate stage 2, and the upper surface 3F of the measurement stage 3) that opposes the lower surface.

The second nozzle member 108 comprises a supply port 181, which is capable of supplying the cleaning liquid LC, and a recovery port 182, which is capable of recovering the cleaning liquid LC. The supply port 181 is formed in substantially the center of the lower surface of the second nozzle member 108. The recovery port 182 is formed in the lower surface of the second nozzle member 108 so that it surrounds the supply port 181.

The cleaning liquid LC is supplied from the cleaning liquid producing apparatus 20 (the 20E) to the supply port 181 through a supply passageway 184, which is formed inside the second nozzle member 108, and a supply pipe 185. The recovery port 182 is connected to a liquid recovery apparatus that is capable of recovering at least the cleaning liquid LC through a recovery passageway 187, which is formed inside the second nozzle member 108, and a recovery pipe 188.

In the same manner as the embodiments discussed above, the nozzle member 8 is disposed at a position that is spaced apart from the second nozzle member 108 and forms the immersion space using the exposure liquid LQ so that the exposure liquid LQ fills the optical path space of the exposure light EL between the last optical element FL and the substrate P during the exposure of the substrate P.

In addition, during the performance of the cleaning operation, the immersion space of the cleaning liquid LC is formed between the second nozzle member 108 and the cleaning target members (e.g., the substrate stage 2 and the measurement stage 3) and those members are cleaned in the same manner as in the embodiments discussed above.

As explained above, the second nozzle member 108 that forms the immersion space with the cleaning liquid LC is provided separately from the nozzle member 8 that forms the immersion space with the exposure liquid LQ, and it is thereby possible to clean the members that constitute the exposure apparatus EX with the cleaning liquid LC. In this case, the second nozzle member 108 is disposed at a position that is spaced apart from the nozzle member 8, and therefore, for example, when the second nozzle member 108 is used to clean the substrate stage 2, the measurement stage 3 may be moved to a position that opposes the last optical element FL of the projection optical system PL and the nozzle member 8, and the measurement operation that uses, for example, a sensor that is mounted to the measurement stage 3 may be performed in parallel with the cleaning of the substrate stage 2. Conversely, the operation of using the second nozzle member 108 to clean the measurement stage 3 may be performed in parallel with the operation of exposing the substrate P that is held by the substrate stage 2.

Furthermore, the first through fifth embodiments discussed above use the cleaning liquid LC in which nitrogen is dissolved, but the gas that is dissolved in the cleaning liquid LQ is not limited to nitrogen, and may be at least one of, for example, ozone, oxygen, hydrogen, carbon dioxide, argon, and clean air. The use of the cleaning liquid LC in which at least one of these gases is dissolved also makes it possible to clean the members that constitute the exposure apparatus EX satisfactorily by generating microbubbles and/or bubbles of a larger size.

Furthermore, in each of the embodiments discussed above, the exposure liquid LQ in which a prescribed gas is dissolved is used as the cleaning liquid LC, but a liquid other than the exposure liquid LQ may be used. Even if a liquid other than the exposure liquid LQ is used, it is possible to clean the members satisfactorily by generating microbubbles and/or bubbles of a larger size. Particularly in the fifth embodiment discussed above, if the second nozzle member 108 is used, then the cleaning liquid LC does not contact the last optical element FL, and therefore it is acceptable to use a liquid other than the exposure liquid LQ.

Furthermore, in each of the embodiments discussed above, the cleaning liquid LC contains ammonia, which serves as the alkali, but, for example, the developing solution that is used in the process of developing the substrate P after the exposure may be used as the alkali contained in the cleaning liquid LC.

Furthermore, in each of the embodiments discussed above, the cleaning liquid LC contains an alkali, but it does not necessarily need to contain such.

In addition, in each of the embodiments discussed above, vibrations may be applied to the cleaning liquid LC that forms the immersion space in order to promote the cleaning effect. In this case, it is preferable to apply ultrasonic waves to the cleaning liquid LC. In order to apply vibrations to the cleaning liquid LC, an oscillator, such as a piezoelectric device, may be provided to the nozzle member and/or the object (the substrate stage 2 and/or the measurement stage 3) that opposes the nozzle member. Alternatively, the drive mechanism 5 may be used to vibrate the substrate stage 2 and/or the measurement stage 3 in order to apply vibrations to the cleaning liquid LC.

In addition, in the embodiments discussed above, the cleaning liquid LC was supplied from above the substrate stage 2 and/or the measurement stage 3, but it may be supplied via a supply port that is provided to the substrate stage 2 and/or the measurement stage 3. In this case, the cleaning liquid LC may be recovered via a recovery port that is provided to the substrate stage 2 and/or the measurement stage 3, or the cleaning liquid LC may be recovered via the recovery port 82 of the nozzle member (8, 108).

Furthermore, in each of the embodiments discussed above, the cleaning operation that uses the cleaning liquid LC is controlled based on the detection results of the detection apparatus 80, but the operation of cleaning with the cleaning liquid LC may be performed, for example, every time a prescribed number of substrates P is exposed, with every lot, or at prescribed intervals.

Figure 14A:
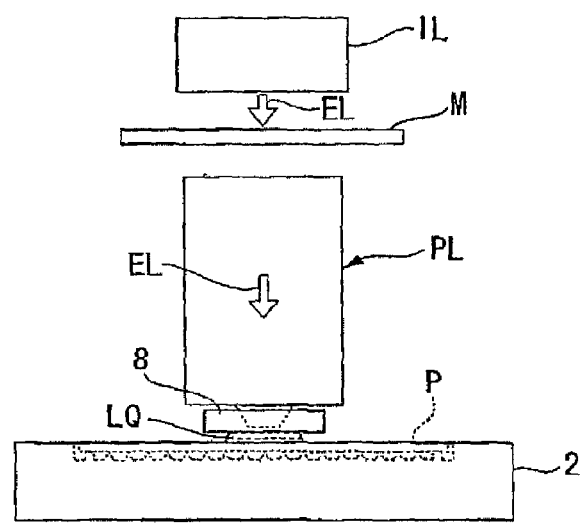
FIG. 14A is a view that shows the state wherein the contamination state of a substrate stage is being detected.
Figure 14B:
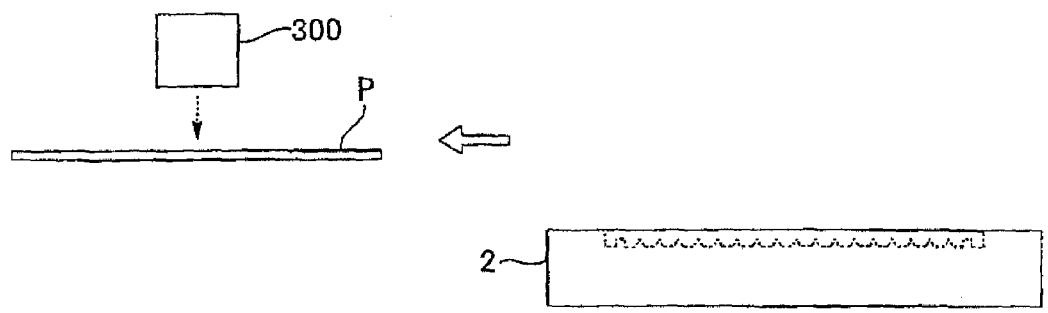
FIG. 14B is a view that shows the state wherein the contamination state of a substrate stage is being detected.

In addition, the exposure substrate P may be exposed with the image of the pattern of the mask M as shown in FIG. 14A, and then the development process may be performed; subsequently, as shown in FIG. 14B, the shape of the pattern that is formed on that exposure substrate P may be measured with a prescribed measuring apparatus 300 and, based on that measurement result, a determination may be made as to whether to perform the cleaning operation. For example, if it is determined, based on the measurement result of the shape of the pattern, that a pattern defect is not within a permissible range, then the control apparatus 7 determines that the contamination state of, for example, the substrate stage 2 is not within the permissible range, and therefore performs the cleaning operation.

Furthermore, in each of the embodiments discussed above, the optical path space on the light emitting side (the image plane side) of the last optical element of the projection optical system is filled with the liquid, but it is also possible to employ a projection optical system wherein the optical path space on the light incident side (the object plane side) of the last optical element is also filled with the liquid, as disclosed in PCT International Publication No. WO 2004/019128. In this case, the cleaning liquid discussed above may flow to the optical path space on the light incident side of the last optical element.

Furthermore, although the exposure liquid LQ in each of the embodiments discussed above is pure water, it may be a liquid other than pure water; for example, if the light source of the exposure light EL is an $F_2$ laser, then this $F_2$ laser light will not transmit through water, so it would be acceptable to use a fluorine based fluid that is capable of transmitting $F_2$ laser light, such as perfluorinated polyether (PFPE) or fluorine based oil as the liquid LQ. In addition, it is also possible to use, as the liquid LQ, a liquid (e.g., cedar oil) that is transparent to the exposure light EL, has the highest possible refractive index, and is stable with respect to the projection optical system PL and the photoresist coated on the front surface of the substrate P. In addition, a liquid that has a refractive index of approximately 1.6 to 1.8 may be used as the liquid LQ. Furthermore, the optical element (the last optical element FL and the like) of the projection optical system PL that contacts the liquid LQ may be formed from a material that has a refractive index that is higher than that of silica glass or calcium fluorite (e.g., higher than 1.6). It is also possible to use various fluids, e.g., a supercritical fluid, as the liquid LQ.

Furthermore, the substrate P in each of the abovementioned embodiments is not limited to a semiconductor wafer for fabricating semiconductor devices, but can also be, for example, a glass substrate for display devices, a ceramic wafer for thin film magnetic heads, or a mask or the original plate of a reticle (synthetic quartz or silicon wafer) used by an exposure apparatus. The shape of the substrate is not limited to a circle, and it may be another shape, e.g., a rectangle.

The exposure apparatus EX can also be adapted to a step-and-scan type scanning exposure apparatus (a scanning stepper) that scans and exposes the pattern of the mask M by synchronously moving the mask M and the substrate P, as well as to a step-and-repeat type projection exposure apparatus (a stepper) that performs full field exposure of the pattern of the mask M with the mask M and the substrate P in a stationary state, and sequentially steps the substrate P.

Furthermore, when performing an exposure with a step-and-repeat system, the projection optical system is used to transfer a reduced image of a first pattern onto the substrate P in a state wherein the first pattern and the substrate P are substantially stationary, after which the projection optical system may be used to perform a full-field exposure of the substrate P, wherein a reduced image of a second pattern partially superposes the transferred first pattern (as in a stitching type full-field exposure apparatus), in a state wherein a second pattern and the substrate P are substantially stationary. In addition, the stitching type exposure apparatus can also be adapted to a step-and-stitch type exposure apparatus that transfers at least two patterns onto the substrate P so that they partially overlap and sequentially steps the substrate P.

In addition, the present invention can also be adapted to a multistage (twin stage) type exposure apparatus that is provided with a plurality of substrate stages, as disclosed in Japanese Patent Application, Publication No. H10-163099, Japanese Patent Application, Publication No. H10-214783, Published Japanese Translation No. 2000-505958 of the PCT International Publication, U.S. Pat. No. 6,341,007, U.S. Pat. No. 6,400,441, U.S. Pat. No. 6,549,269, and U.S. Pat. No. 6,590,634.

In addition, the present invention can also be adapted to an exposure apparatus that does not comprise the measurement stage, as disclosed in PCT International Publication No. WO 99/49504. In addition, the present invention can also be adapted to an exposure apparatus that comprises a plurality of substrate stages and measurement stages.

In addition, in the embodiments discussed above, an exposure apparatus is employed that locally fills the liquid between the projection optical system PL and the substrate P; however, the present invention can also be adapted to a liquid immersion exposure apparatus that exposes the entire front surface of a substrate to be exposed in a state wherein the substrate is immersed in liquid, as disclosed in, for example, Japanese Patent Application, Publication No. H6-124873, Japanese Patent Application, Publication No. H10-303114, and U.S. Pat. No. 5,825,043.

Each of the abovementioned embodiments was explained by taking as an example an exposure apparatus that is provided with the projection optical system PL, but the present invention can be adapted to an exposure apparatus and an exposing method that do not use the projection optical system PL. Even if the projection optical system PL is not used, the exposure light is radiated onto the substrate through optical members, such as lenses, and an immersion space is formed in a prescribed space between the substrate and such optical members.

The type of exposure apparatus EX is not limited to a semiconductor device fabrication exposure apparatus that exposes the substrate P with the pattern of a semiconductor device, but can also be widely adapted to an exposure apparatus that is used for fabricating, for example, either liquid crystal devices or displays, and to an exposure apparatus that is used for fabricating thin film magnetic heads, imaging devices (CCDs), micromachines, MEMS, DNA chips, or reticles and masks.

Furthermore, in the embodiments discussed above, a light transmitting type mask is used wherein a prescribed shielding pattern (or a phase pattern or a dimming pattern) is formed on a light transmitting substrate; however, instead of such a mask, it is also possible to use an electronic mask wherein a transmittance pattern, a reflected pattern, or a light emitting pattern is formed based on electronic data of the pattern to be exposed, as disclosed in, for example, U.S. Pat. No, 6,778, 257; here, electronic masks, which are also called variable forming masks, include, for example, a digital micromirror device (DMD), which is one type of a non light emitting image display device (spatial light modulator).

In addition, by forming interference fringes on the substrate P as disclosed in, for example, PCT International Publication No. WO 2001/035168, the present invention can also be adapted to an exposure apparatus (a lithographic system) that exposes the substrate P with a line-and-space pattern.

In addition, the present invention can also be adapted to, for example, an exposure apparatus that combines the patterns of two masks on a substrate through a projection optical system, and double exposes, substantially simultaneously, a single shot region on the substrate with a single scanning exposure, as disclosed in, for example, Published Japanese Translation No. 2004-519850 of the PCT International Publication (corresponding U.S. Pat. No. 6,611,316). In addition, the present invention can also be adapted to, for example, a proximity type exposure apparatus and a mirror projection aligner.

In addition, the abovementioned embodiments explained the present invention using an immersion exposure apparatus; however, for example, as described in the fifth embodiment, if a cleaning station is provided at a position that is spaced apart from the projection optical system PL, then the cleaning operation that uses the cleaning liquid LC may be performed by connecting the abovementioned cleaning liquid producing apparatus to a dry exposure apparatus that performs exposures through a gas space.

In addition, the cleaning operation that uses the cleaning liquid LC may be performed by connecting the cleaning liquid producing apparatus that was discussed above not only to an exposure apparatus (a lithographic apparatus), but also to an inspection apparatus and/or an observation apparatus that uses immersion technology, as disclosed in, for example, U.S. Patent Application, Publication No. 2005/0179997.

Furthermore, each disclosure of every published patent application and U.S. patent related to the exposure apparatus recited in the abovementioned embodiments, modified examples, and the like is hereby incorporated by reference in its entirety. In addition, the operations and/or constituent elements described in the above embodiments can be used appropriately in combination. Moreover, part of the operations and/or constitute elements described in the above embodiments may be appropriately omitted.

As described above, the exposure apparatus EX of the embodiments in the present application is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EX in a clean room wherein, for example, the temperature and the cleanliness level are controlled.

Figure 15:
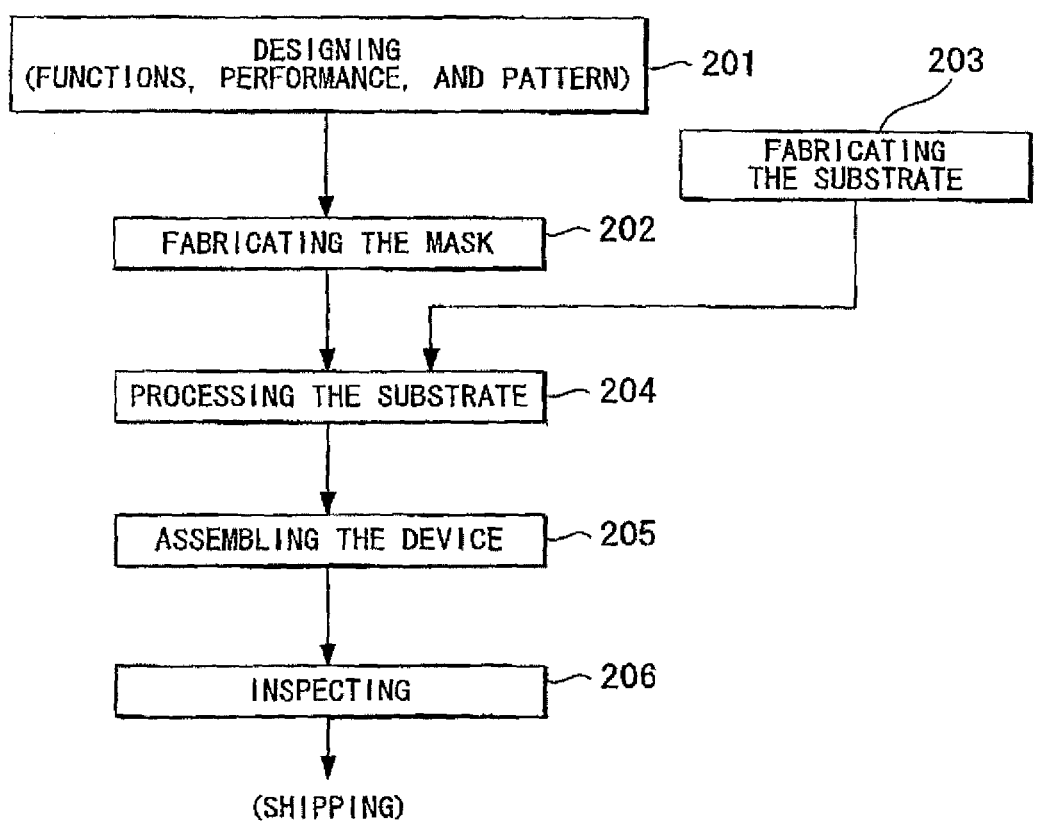
FIG. 15 is a flow chart diagram that depicts one example of a process for fabricating a microdevice.

As shown in FIG. 15, a micro-device, such as a semiconductor device, is manufactured by: a step 201 that designs the functions and performance of the micro-device; a step 202 that fabricates a mask (a reticle) based on this design step; a step 203 that fabricates a substrate, which is the base material of the device; a substrate processing step 204 that includes a substrate process (an exposure process) wherein, in accordance with the embodiments discussed above, the substrate is exposed with a pattern of the mask and the exposed substrate is then developed; a device assembling step 205 (comprising fabrication processes such as a dicing process, a bonding process, and a packaging process); an inspecting step 206; and the like.

What is claimed is:

1. A cleaning method for cleaning at least a part of an exposure apparatus with a cleaning liquid, the exposure apparatus exposing a substrate with an exposure light through an exposure liquid disposed in a space, the method comprising:
supplying a liquid through a first passageway, the first passageway being connected to a second passageway which is arranged to receive the liquid from the first passageway and which is connected to a cleaning liquid generating apparatus and the first passageway being connected to a third passageway which is arranged to receive the liquid from the first passageway to supply the exposure liquid from a liquid supply port of the exposure apparatus,
supplying the liquid to the cleaning liquid generating apparatus via the second passageway,
generating the cleaning liquid at the cleaning liquid generating apparatus by dissolving into the liquid, a prescribed gas of an amount that is greater than a saturation concentration of the prescribed gas in the liquid in which the prescribed gas is dissolved to form a supersaturated state at a pressure in the space;
feeding the cleaning liquid to the liquid supply port of the exposure apparatus from the cleaning liquid generating apparatus without flowing the cleaning liquid through an exposure liquid producing apparatus to clean the at least a part of the exposure apparatus; and
adjusting a pressure applied to the cleaning liquid, by a pressure adjustment mechanism so that the supersaturated state of the cleaning liquid is able to generate bubbles of the prescribed gas in a vicinity of the liquid supply port that is downstream of the pressure adjusting mechanism.

2. The method according to claim 1, further comprising:
measuring the pressure, by a sensor, to determine a measurement result; and
controlling the pressure adjustment mechanism based on the measurement result.

3. The method according to claim 1, wherein the prescribed gas includes nitrogen.

4. The method according to claim 1, wherein the prescribed gas includes at least one of ozone, oxygen, hydrogen, carbon dioxide, argon, and clean air.

5. The method according to claim 1, wherein the liquid is the exposure liquid.

6. The method according to claim 5, wherein the exposure liquid includes pure water.

7. The method according to claim 1, wherein the cleaning liquid contains an alkali.

8. The method according to claim 7, wherein the alkali includes ammonia.

* * * * *